United States Patent
Lo et al.

(10) Patent No.: US 12,453,038 B2
(45) Date of Patent: Oct. 21, 2025

(54) ELECTRONIC DEVICE AND AIRFLOW GENERATING PACKAGE

(71) Applicant: xMEMS Labs, Inc., Santa Clara, CA (US)

(72) Inventors: Chiung C. Lo, San Jose, CA (US); Wen-Chien Chen, New Taipei (TW); Chun-I Chang, Hsinchu County (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 19/007,559

(22) Filed: Jan. 2, 2025

(65) Prior Publication Data
US 2025/0227874 A1    Jul. 10, 2025

Related U.S. Application Data

(60) Provisional application No. 63/664,713, filed on Jun. 26, 2024, provisional application No. 63/618,391, filed on Jan. 8, 2024.

(51) Int. Cl.
*H05K 7/20* (2006.01)
*H10N 30/20* (2023.01)
(Continued)

(52) U.S. Cl.
CPC ..... *H05K 7/20154* (2013.01); *H10N 30/2047* (2023.02); *H10N 30/88* (2023.02); *H10N 39/00* (2023.02)

(58) Field of Classification Search
CPC .............. H04R 2201/003; H04R 17/00; H04R 2217/03; H04R 1/2811; H04R 1/24;
(Continued)

(56) References Cited

U.S. PATENT DOCUMENTS 4,498,851 A * 2/1985 Kolm ..................... F04D 33/00
                                                               310/331
5,008,582 A * 4/1991 Tanuma ................ H01L 23/467
                                                               310/330
(Continued)

FOREIGN PATENT DOCUMENTS

EP           4 283 610 A1    11/2023

*Primary Examiner* — Michael A Matey
(74) *Attorney, Agent, or Firm* — Winston Hsu

(57) ABSTRACT

An electronic device includes an operational component, a heat conductive component and an airflow generating package. The operational component produces a heat while operating. The heat conductive component is configured to conduct the heat generated by the operational component, wherein the operational component is disposed on the heat conductive component. The airflow generating package is disposed by an edge of the electronic device. The airflow generating package includes a film structure, the film structure includes a flap pair, and the flap pair includes a first flap and a second flap. The flap pair operates at an ultrasonic rate to produce an airflow. The heat conductive component extends toward the airflow generating package, such that the airflow generated by the airflow generating package flows through the heat conductive component, so as to dissipate the heat generated from the operational component through the heat conductive component.

29 Claims, 28 Drawing Sheets

(51) Int. Cl.
*H10N 30/88* (2023.01)
*H10N 39/00* (2023.01)

(58) Field of Classification Search
CPC ... H04R 2499/11; H04R 23/00; F04B 43/046;
F04B 17/003; H05K 7/20; H05K
7/20172; H05K 7/20272; H05K 1/0203;
H05K 1/181; H05K 7/20154; H05K
7/20254; H05K 7/2039; H10N 30/2047;
H10N 30/072; H10N 30/704; H10N
39/00; H10N 30/88; B81B 7/0093; B81B
3/0021; F16K 99/0048; G01L 9/008;
G01L 9/06; G11B 33/142; G06F 1/20;
G06F 1/206; Y10S 310/80
See application file for complete search history.

(56) References Cited

U.S. PATENT DOCUMENTS

| | | | | | |
|---|---|---|---|---|---|
| 5,861,703 | A * | 1/1999 | Losinski | ............ | H10N 30/2042 |
| | | | | | 310/330 |
| 7,307,841 | B2 * | 12/2007 | Berlin | ............... | H05K 7/20909 |
| | | | | | 257/E23.098 |
| 8,520,383 | B2 * | 8/2013 | Park | ...................... | F28F 13/02 |
| | | | | | 361/679.48 |
| 8,681,495 | B2 * | 3/2014 | Burton | ................ | H04N 21/426 |
| | | | | | 174/547 |
| 8,684,707 | B2 * | 4/2014 | Kanai | ................... | F04B 45/047 |
| | | | | | 417/410.2 |
| 8,899,944 | B2 * | 12/2014 | Kanai | ................... | F04D 33/00 |
| | | | | | 417/413.2 |
| 9,368,426 | B2 * | 6/2016 | Tanida | .................. | F04D 33/00 |
| 9,523,367 | B2 * | 12/2016 | Lucas | ................... | H10N 30/50 |
| 10,480,502 | B2 * | 11/2019 | Hirata | ................. | F04B 45/047 |
| 11,503,742 | B2 * | 11/2022 | Mukundan | ......... | H05K 7/20172 |
| 11,744,038 | B2 * | 8/2023 | Sathyamurthy | ....... | H01L 23/467 |
| | | | | | 165/80.2 |
| 11,802,554 | B2 * | 10/2023 | Yalamarthy | .......... | F04B 43/046 |
| 2004/0190305 | A1 * | 9/2004 | Arik | ..................... | F21V 29/763 |
| | | | | | 362/555 |
| 2005/0018016 | A1 * | 1/2005 | Silverbrook | ........... | B41J 2/1635 |
| | | | | | 347/54 |
| 2005/0074662 | A1 * | 4/2005 | Cho | ......................... | G06F 1/20 |
| | | | | | 429/444 |
| 2006/0268534 | A1 * | 11/2006 | Paydar | .................. | H01L 23/467 |
| | | | | | 361/814 |
| 2007/0037506 | A1 * | 2/2007 | Lee | ......................... | F04D 33/00 |
| | | | | | 454/184 |
| 2008/0041574 | A1 * | 2/2008 | Arik | .................... | H01L 23/4735 |
| | | | | | 165/80.2 |
| 2008/0238256 | A1 * | 10/2008 | Leija | ...................... | F04D 33/00 |
| | | | | | 310/328 |
| 2009/0004034 | A1 * | 1/2009 | Lee | ...................... | F04B 17/003 |
| | | | | | 417/410.2 |
| 2009/0085438 | A1 * | 4/2009 | Chrysler | ................. | F04D 33/00 |
| | | | | | 310/331 |
| 2009/0167109 | A1 * | 7/2009 | Tomita | .................. | H04N 23/52 |
| | | | | | 310/317 |
| 2009/0273636 | A1 * | 11/2009 | Silverbrook | ......... | B41J 2/14427 |
| | | | | | 347/40 |
| 2009/0273640 | A1 * | 11/2009 | Silverbrook | ........... | B41J 2/1626 |
| | | | | | 347/47 |
| 2009/0279255 | A1 * | 11/2009 | Sauciuc | .................... | G06F 1/20 |
| | | | | | 361/695 |
| 2011/0120679 | A1 * | 5/2011 | Tanaka | ................. | H01L 23/467 |
| | | | | | 417/413.2 |
| 2016/0090300 | A1 * | 3/2016 | Tsai | ..................... | B81C 1/00246 |
| | | | | | 257/254 |
| 2016/0358841 | A1 * | 12/2016 | Eid | ........................ | H05K 1/181 |
| 2016/0377072 | A1 * | 12/2016 | Wu | ........................ | F04B 53/10 |
| | | | | | 417/53 |
| 2017/0276149 | A1 | 9/2017 | Dusseau | | |
| 2019/0172816 | A1 | 6/2019 | Kim | | |
| 2019/0187459 | A1 | 6/2019 | Matsumaru | | |
| 2020/0049386 | A1 * | 2/2020 | Ganti | .................... | F04B 45/043 |
| 2021/0144884 | A1 * | 5/2021 | Mou | .................. | H10N 30/875 |
| 2021/0147221 | A1 * | 5/2021 | Mou | .................. | H10N 30/2047 |
| 2021/0183739 | A1 * | 6/2021 | Sathyamurthy | ..... | H01L 23/4336 |
| 2021/0392788 | A1 * | 12/2021 | Yalamarthy | ........... | F04D 25/166 |
| 2022/0014838 | A1 * | 1/2022 | Liang | .................... | H04R 1/1066 |
| 2022/0224999 | A1 * | 7/2022 | Liang | .................... | H04R 7/04 |
| 2022/0315412 | A1 * | 10/2022 | Liang | .................... | B81B 3/0021 |
| 2023/0209241 | A1 * | 6/2023 | Lo | ........................ | H04R 1/1041 |
| | | | | | 381/328 |
| 2024/0121547 | A1 * | 4/2024 | Chen | .................. | H04R 17/02 |
| 2024/0262679 | A1 * | 8/2024 | Chang | .................. | B81B 3/0051 |

* cited by examiner

ELECTRONIC DEVICE AND AIRFLOW GENERATING PACKAGE

CROSS REFERENCE TO RELATED APPLICATIONS

This application claims the benefit of U.S. Provisional Application No. 63/618,391, filed on Jan. 8, 2024. Further, this application claims the benefit of U.S. Provisional Application No. 63/664,713, filed on Jun. 26, 2024. The contents of these applications are incorporated herein by reference.

BACKGROUND OF THE INVENTION

1. Field of the Invention

The present application relates to an electronic device and an airflow generating package, and more particularly, to an electronic device and an airflow generating package with improved heat dissipation.

2. Description of the Prior Art

Nowadays, a heat management of a device highly affects performances of components in this device, such that performance of this device is highly related to its heat management. For instance, as an electronic device (e.g., a smartphone or a tablet), which is a kind of device, slims down, it also demands increasingly more complicated computations and thus drains more battery power. Meanwhile, AI (artificial intelligence) computation has booming demand and heat management is crucial for AI computing performance. Accordingly, the heat management is of escalating importance for the future viability of the electronic device (e.g., a palm-sized electronic device, or a server in data center).

Therefore, it is necessary to improve the heat management (e.g., the heat dissipation), so as to improve the performance of the device.

SUMMARY OF THE INVENTION

It is therefore a primary objective of the present invention to provide an electronic device, wherein the heat dissipation of the electronic device is improved due to an existence of a component configured to produce a plurality of air pulses. Furthermore, the present invention provides a related airflow generating package. Furthermore, the present invention provides a semiconductor device which is a kind of above electronic device.

An embodiment of the present invention provides an electronic device including an operational component, a heat conductive component and an airflow generating package. The operational component produces a heat while operating. The heat conductive component is configured to conduct the heat generated by the operational component, wherein the operational component is disposed on the heat conductive component. The airflow generating package is disposed by an edge of the electronic device. The airflow generating package includes a film structure, the film structure includes a flap pair, and the flap pair includes a first flap and a second flap. The flap pair operates at an ultrasonic rate to produce an airflow. The heat conductive component extends toward the airflow generating package, such that the airflow generated by the airflow generating package flows through the heat conductive component, so as to dissipate the heat generated from the operational component through the heat conductive component.

An embodiment of the present invention provides an airflow generating package including a base and a film structure. The film structure is disposed on the base and operates at an ultrasonic rate so that the airflow generating package produces an airflow. An air channel is formed within the base such that the airflow flows through the air channel. A flowing direction of the airflow within the air channel is perpendicular to a normal direction of the film structure.

An embodiment of the present invention provides an airflow generating package including a film structure and a covering structure. The film structure operates at an ultrasonic rate so that the airflow generating package produces an airflow. A plurality of protrusions are disposed on the covering structure, so to enhance heat dissipation when the airflow produced by the film structure flows through.

An embodiment of the present invention provides an airflow generating package including a housing, a film structure and a chamber. The film structure is disposed within the housing and operates at an ultrasonic rate so that the airflow generating package produces an airflow. The chamber is formed on a side of the film structure. An air opening is formed on a sidewall of the housing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
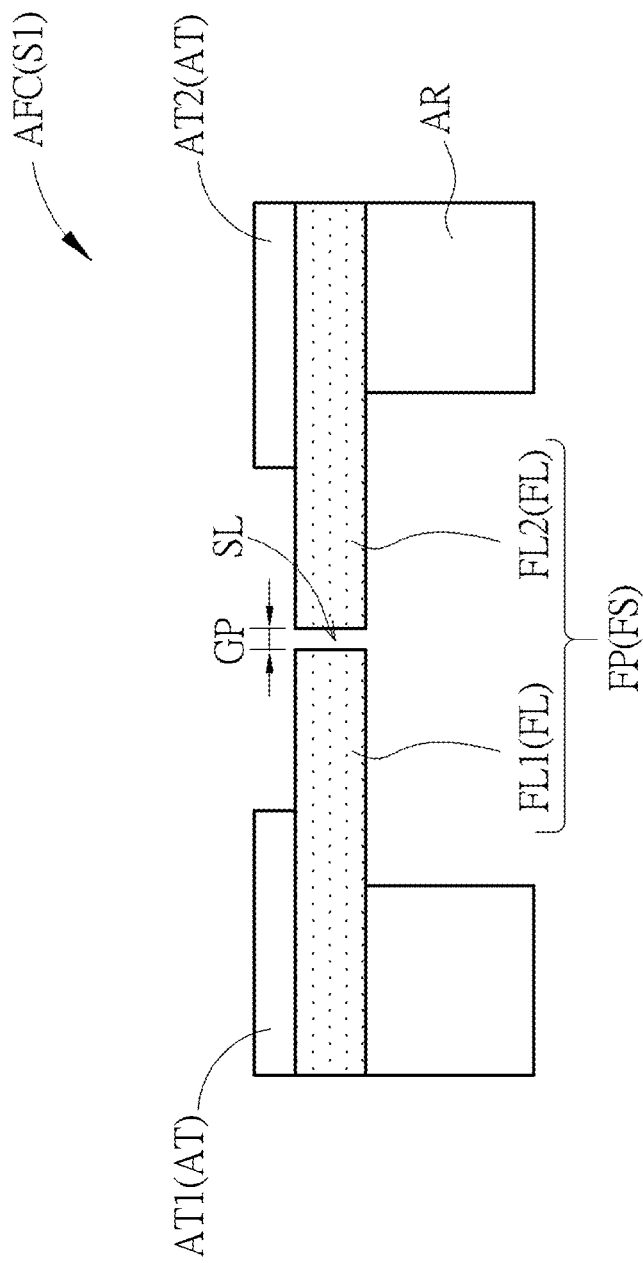
FIG. 1 is a schematic diagram of a cross sectional view illustrating an airflow generating chip according to an embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

In the following description and in the claims, when a component or layer is referred to as being "connected to" another component or layer, it can be directly connected to this another component or layer, or intervening components or layers may be presented. In contrast, when a component is referred to as being "directly connected to" another component or layer, there are no intervening components or layers presented.

In the following description and in the claims, when "a A1 component is formed by/of B1", B1 exist in the formation of A1 component or B1 is used in the formation of A1 component, and the existence and use of one or a plurality of other features, areas, steps, operations and/or components are not excluded in the formation of A1 component.

In the following description and in the claims, the term "chamber" generally means an object having an empty space inside itself. In the following description and in the claims, the term "cavity" means an empty space inside an object. For example, a cavity of a chamber is an empty space existing inside the chamber, and the chamber is a shell of this cavity.

In the following description and in the claims, the term "substantially" generally means a small deviation may exist or not exist. For instance, the terms "substantially parallel" and "substantially along" means that an angle between two components may be less than or equal to a certain degree threshold, e.g., 10 degrees, 5 degrees, 3 degrees or 1 degree. For instance, the term "substantially aligned" means that a deviation between two components may be less than or equal to a certain difference threshold, e.g., 2 µm or 1 µm. For instance, the term "substantially the same" means that a deviation is within, e.g., 10% of a given value or range, or mean within 5%, 3%, 2%, 1%, or 0.5% of a given value or range.

In the description and following claims, the term "horizontal direction" generally means a direction parallel to a horizontal plane, the term "horizontal plane" generally means a plane parallel to a direction X and a direction Y in the drawings (i.e., the direction X and the direction Y of the present invention may be considered as the horizontal directions), the term "vertical direction" and the term "top-view direction" generally mean a direction parallel to a direction Z and perpendicular to the horizontal direction in the drawings, and the direction X, the direction Y and the direction Z are perpendicular to each other. In the description and following claims, the term "top view" generally means a viewing result viewing along the vertical direction. In the description and following claims, the term "cross-sectional view" generally means a structure cut along the vertical direction is viewed along the horizontal direction.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention. That is, the technical features described in the embodiments may be mixed or combined in various ways as long as there are no conflicts between them.

In the present invention, an airflow generating component is configured to generate an airflow, and the heat dissipation is implemented and/or improved by the airflow caused by the airflow generating component. In the present invention, the airflow generating component may be designed based on requirement(s), and the airflow generating component may be formed by any suitable method. In the following, some embodiments of the airflow generating component are explained.

For example, the airflow generating component may be an airflow generating chip, wherein the airflow generating chip may be formed by a semiconductor manufacturing process. For example, the airflow generating chip may be a micro electro mechanical system (MEMS) chip including a MEMS structure, but not limited thereto.

Figure 2:
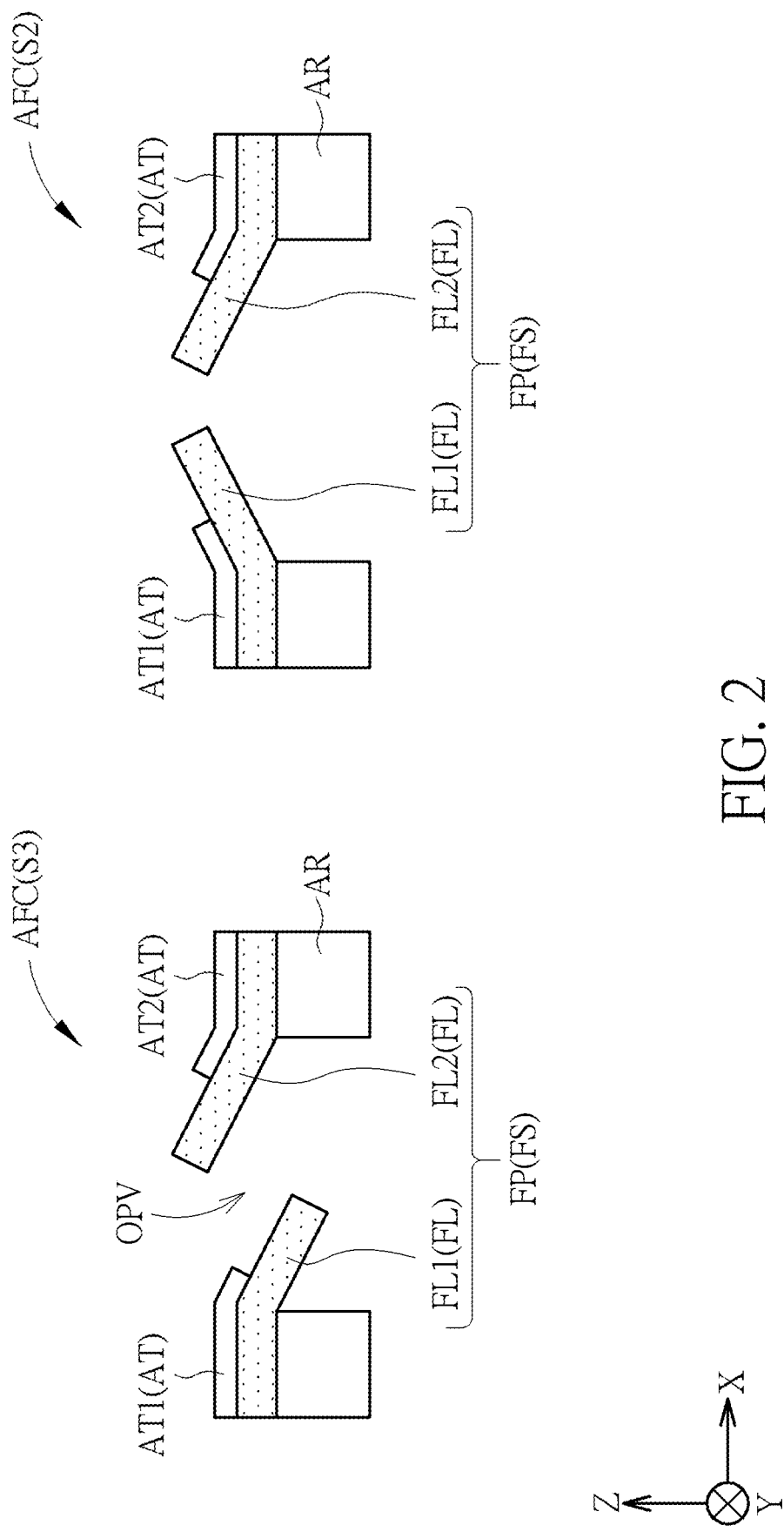
FIG. 2 is a schematic diagram of a cross sectional view illustrating a common mode movement and a differential mode movement of the airflow generating chip according to an embodiment of the present invention.

Referring to FIG. 1 and FIG. 2, FIG. 1 is a schematic diagram of a cross sectional view illustrating an airflow generating chip according to an embodiment of the present invention, and FIG. 2 is a schematic diagram of a cross sectional view illustrating a common mode movement and a differential mode movement of the airflow generating chip according to an embodiment of the present invention, wherein the airflow generating chip AFC shown in FIG. 1 is in an intermediate status S1. As shown in FIG. 1 and FIG. 2, the airflow generating chip AFC is configured to generate an airflow. In some embodiments, the airflow generating chip AFC may be configured to produce a plurality of air pulses, and the airflow may be consists of the air pulses, wherein the airflow generating chip AFC may produce the air pulses at any suitable pulse rate. For example, the airflow generating chip AFC may produce the air pulses at an ultrasonic (pulse) rate higher than a maximum human audible frequency (e.g., 16 kHz, 20 kHz or 22 kHz), such that the user cannot hear the operation of the airflow generating chip AFC configured to generate the airflow and/or the air pulses, but not limited thereto.

As shown in FIG. 1, the airflow generating chip AFC may include at least one anchor structure AR and at least one film structure FS anchored by/on the anchor structure AR, wherein the anchor structure AR may be disposed outside the film structure FS. The film structure FS and the anchor structure AR may include any suitable material(s). In some embodiments, the film structure FS and the anchor structure AR may individually include silicon (e.g., single crystalline silicon or poly-crystalline silicon), silicon compound (e.g., silicon carbide, silicon oxide), germanium, germanium compound, gallium, gallium compound (e.g., gallium nitride or gallium arsenide), other suitable material or a combination thereof, but not limited thereto. In some embodiments, the film structure FS and the anchor structure AR may have the same material.

In the operation of the airflow generating chip AFC, the film structure FS may be actuated to have a movement, and the anchor structure AR may be immobilized. Namely, the anchor structure AR may be a fixed end (or fixed edge) respecting the film structure FS during the operation of the airflow generating chip AFC. In some embodiments, the film structure FS may be actuated to move upwards and downwards, but not limited thereto. In the present invention, the terms "move upwards" and "move downwards" represent that the film structure FS moves substantially along the direction Z. Moreover, "upwards" may refer to the direction Z (i.e., +Z direction) while "downwards" may refer to a direction opposite to the direction Z (i.e., −Z direction). Namely, an actuating direction of the film structure FS is parallel to the direction Z.

As shown in FIG. 1, the film structure FS of the airflow generating chip AFC includes at least one slit SL, and the film structure FS is divided into a plurality of flaps FL by the slit(s) SL (i.e., the flaps FL are separated from each other by the slit(s) SL, and the slit(s) SL may be boundaries of the flaps FL), wherein the number of the flaps FL may be designed based on requirement(s). For example, as shown in FIG. 1, the film structure FS may be divided into a first flap FL1 and a second flap FL2 by the slit(s) SL, the first flap FL1 and the second flap FL2 may be disposed opposite to each other, and at least one slit SL may be between the first flap FL1 and the second flap FL2. Note that the first flap FL1 and the second flap FL2 opposite to each other may form a flap pair FP in the film structure FS.

In FIG. 1, the flaps FL of the film structure FS has at least one anchor edge (or anchor end) anchored on the anchor structure AR and at least one free edge (or free end) which is not permanently anchored on any component within the airflow generating chip AFC, and the anchor edge(s) and the free edge(s) of each flap FL may be designed based on requirement(s). For example (as shown in FIG. 1), the slit SL may define one free edge of the first flap FL1 and one free edge of the second flap FL2, this free edge of the first flap FL1 may be opposite to the anchor edge of the first flap FL1, and this free edge of the second flap FL2 may be opposite to the anchor edge of the second flap FL2, but not limited thereto.

In the present invention, the number of the slit(s) SL included in the film structure FS may be adjusted based on requirement(s), and the slit(s) SL may be disposed at any suitable position of the film structure FS and have any suitable top-view pattern. For example, the slit SL may be a straight slit, a curved slit, a combination of straight slits, a combination of curved slits or a combination of straight slit(s) and curved slit(s).

The airflow generating chip AFC may include an actuator AT configured to actuate the film structure FS to generate the airflow and/or the air pulses, wherein the actuator AT may be disposed at any suitable position, and the position of the actuator AT may be related to the actuating method of the actuator AT. For instance, in FIG. 1, the actuator AT may overlap the film structure FS in the direction Z, but not limited thereto. For instance, in FIG. 1, the actuator AT may be disposed on the film structure FS, but not limited thereto. For instance, in FIG. 1, the actuator AT may be in contact with the film structure FS, but not limited thereto.

As shown in FIG. 1, the actuator AT may include a plurality of actuating portions disposed on the plurality of flaps FL of the film structure FS. For instance (as shown in FIG. 1), the actuator AT includes a first actuating portion AT1 disposed on the first flap FL1 and a second actuating portion AT2 disposed on the second flap FL2.

The actuator AT has a monotonic electromechanical converting function with respect to the movement of the film structure FS along the direction Z. In some embodiments, the actuator AT may include a piezoelectric actuator, an electrostatic actuator, a nanoscopic-electrostatic-drive (NED) actuator, an electromagnetic actuator or any other suitable actuator, but not limited thereto. For example, in an embodiment, the actuator AT may include a piezoelectric actuator, the piezoelectric actuator may contain such as two electrodes and a piezoelectric material layer (e.g., lead zirconate titanate, PZT) disposed between the electrodes, wherein the piezoelectric material layer may actuate the film structure FS based on driving signals (e.g., driving voltages and/or driving voltage difference between two electrodes) received by the electrodes, but not limited thereto. For example, in another embodiment, the actuator AT may include an electromagnetic actuator (such as a planar coil), wherein the electromagnetic actuator may actuate the film structure FS based on a received driving signals (e.g., driving current) and a magnetic field (i.e. the film structure FS may be actuated by the electromagnetic force), but not limited thereto. For example, in still another embodiment, the actuator AT may include an electrostatic actuator (such as conducting plate) or a NED actuator, wherein the electrostatic actuator or the NED actuator may actuate the film structure FS based on a received driving signals (e.g., driving voltage) and an electrostatic field (i.e. the film structure FS may be actuated by the electrostatic force), but not limited thereto. In the following, the actuator AT may be a piezoelectric actuator for example.

For example, if the airflow generating chip AFC is a MEMS chip, the film structure FS, the anchor structure AR and the actuator AT are MEMS structures in the MEMS chip, but not limited thereto. Furthermore, since the airflow generating chip AFC generates the airflow and/or the air pulses by actuating the film structure FS through the actuator AT, the airflow generating chip AFC may be a fanless blower, but not limited thereto.

In the present invention, the film structure FS (the flaps FL) is actuated/controlled to move upwards and downwards by the actuator AT, such that a vent opening OPV related to the slit SL is formed/opened or closed (i.e., the film structure FS is configured to form/open or close the vent opening OPV), wherein the vent opening OPV is formed between opposite sidewalls of the slit SL (i.e., the vent opening OPV is formed between the first flap FL1 and the second flap FL2). Namely, the vent opening OPV is formed because of the slit SL. In the condition "the vent opening OPV is closed/sealed", the air is hard to flow to pass through a space between two opposite sidewalls of the slit SL, meaning that a flowing resistance of the vent opening OPV is large or larger than a threshold. In the condition "the vent opening OPV is formed/opened", the air easily flows to pass through a space between two opposite sidewalls of the slit SL, meaning that the flowing resistance of the vent opening OPV is low or lower than another threshold.

In the present invention, the airflow generating chip AFC may generate the airflow and/or the air pulse by any suitable airflow producing method. For example, an airflow producing method related to FIG. 1 and FIG. 2 are described in the following, and this airflow producing method generates the airflow and/or the air pulse by changing the state of the vent opening OPV and changing the air pressures on two opposite sides of the film structure FS.

As shown in FIG. 1, in the intermediate status S1 of the airflow generating chip AFC, the film structure FS (the flap pair FP) may be actuated and maintained as a first position which is substantially horizontal in the cross sectional view, and the vent opening OPV may be temporarily closed (or even temporarily sealed), such that the air may be hard to flow to pass through a space between two opposite sidewalls of the slit SL. In FIG. 1, two opposite sidewalls of the slit SL (i.e., the free edge of the first flap FL1 and the free edge of the second flap FL2) partially or fully overlap with each other in the horizontal direction (a gap of the slit SL is shown in FIG. 1), so as to make the vent opening OPV closed and have the larger flowing resistance.

In FIG. 1, since a size of the gap GP of the slit SL (or a width of the slit SL) should be sufficiently small, the airflow through the gap GP (i.e., a narrow channel) can be highly damped due to viscous forces/resistance along the walls of the airflow pathways, known as boundary layer effect within field of fluid mechanics. Accordingly, the airflow flowing through the gap GP in the intermediate status S1 is significantly small or negligible. In other words, when the airflow generating chip AFC is in the intermediate status S1, the vent opening OPV is closed and even sealed. The size of the gap GP of the slit SL (or a width of the slit SL) may be designed based on requirement(s). For instance, the size of the gap GP of the slit SL (or a width of the slit SL) may be less than or equal to 5 µm, less than or equal to 3 µm, or less than or equal to 2 µm, or may range from 1 µm to 2 µm, but not limited thereto. Note that the size of the vent opening OPV in the intermediate status S1 is equivalent to the size of the gap GP.

In FIG. 2, the film structure FS (the flap pair FP) may be actuated to perform a common mode movement S2, such that the first flap FL1 and the second flap FL2 are simultaneously actuated to move toward the same direction. For example, the first flap FL1 and the second flap FL2 may be simultaneously actuated to move upwards or downwards. For example, in the end of the common mode movement S2, a distance between the first flap FL1 and the first position and a distance between the second flap FL2 and the first position are the same.

As shown in FIG. 2, when the film structure FS (the flap pair FP) is actuated to perform the common mode movement S2, the vent opening OPV may be temporarily closed (or even temporarily sealed), such that the air may be hard to flow to pass through a space between two opposite sidewalls of the slit SL. In FIG. 2, two opposite sidewalls of the slit SL (i.e., the free edge of the first flap FL1 and the free edge of the second flap FL2) partially or fully overlap with each other in the horizontal direction, so as to make the vent opening OPV closed and have the larger flowing resistance.

When the film structure FS (the flap pair FP) is actuated to perform the common mode movement S2, since the vent opening OPV is temporarily closed and has the larger flowing resistance, the air pressures on two opposite sides of the film structure FS are different to cause an air-pressure difference. Namely, the film structure FS (the flap pair FP) performs the common mode movement S2 to form an air pressure variation.

In FIG. 2, the film structure FS (the flap pair FP) may be actuated to perform a differential mode movement S3, such that the first flap FL1 and the second flap FL2 are simultaneously actuated to move toward opposite directions. For example, the first flap FL1 may be actuated to move downwards and the second flap FL2 may be actuated to move upwards (as shown in FIG. 2), or the first flap FL1 may be actuated to move upwards and the second flap FL2 may be actuated to move downwards. For example, in the end of the differential mode movement S3, a distance between the first flap FL1 and the first position and a distance between the second flap FL2 and the first position are the same.

As shown in FIG. 2, when the film structure FS (the flap pair FP) is actuated to perform the differential mode movement S3, the vent opening OPV may be temporarily opened, such that the air may easily flow to pass through a space between two opposite sidewalls of the slit SL. In FIG. 2, two opposite sidewalls of the slit SL (i.e., the free edge of the first flap FL1 and the free edge of the second flap FL2) do not overlap with each other in the horizontal direction, so as to make the vent opening OPV opened and have the lower flowing resistance.

When the film structure FS (the flap pair FP) is actuated to perform the differential mode movement S3, if the air-pressure difference exists between two opposite sides of the film structure FS, the air naturally flows to pass through the vent opening OPV due to this air-pressure difference and the lower flowing resistance of the vent opening OPV, such that the airflow and/or the air pulse can be generated.

Accordingly, the airflow producing method of this embodiment may generate the airflow and/or the air pulse by actuating the film structure FS (the flap pair FP) to perform the common mode movement S2 and the differential mode movement S3. For instance, one period of the airflow producing method of this embodiment may include four steps, but not limited thereto. The first step of the airflow producing method may be that the film structure FS (the flap pair FP) is actuated to perform the common mode movement S2 to make the air-pressure difference exist between two opposite sides of the film structure FS. The second step of the airflow producing method may be that the film structure FS (the flap pair FP) is actuated to recover the intermediate status S1. The third step of the airflow producing method may be that the film structure FS (the flap pair FP) is actuated to perform the differential mode movement S3 to make air naturally flows to pass through the vent opening OPV due to this air-pressure difference and the lower flowing resistance of the vent opening OPV, such that the airflow and/or the air pulse can be generated. The fourth step of the airflow producing method may be that the film structure FS (the flap pair FP) is actuated to recover the intermediate status S1. By repeating the periods of the airflow producing method of this embodiment, the air pulses may form the airflow continuously.

A frequency of the period may be designed based on the pulse rate of the air pulse, wherein the frequency of the period may be synchronous with the pulse rate of the air pulse. In the present invention, a frequency/rate is synchronous with another frequency/rate generally refers that this frequency/rate is this another frequency/rate times a rational number (i.e., N/M, wherein N and M represent integers). In some embodiments, the frequency of the period may be the same as the pulse rate of the air pulse. In some embodiments, the film structure FS (the flap pair FP) performs the common mode movement S2 to form the air pressure variation with a pressure variant frequency synchronous with the frequency of the period, and the film structure FS (the flap pair FP) performs the differential mode movement S3 to form the vent opening OPV at an opening rate synchronous with the pressure variant frequency and the frequency of the period. For instance, the frequency of the period, the pulse rate of the air pulse, the pressure variant frequency and the opening rate are the same. For instance, if the airflow generating chip AFC produces the air pulses at an ultrasonic rate, the pressure variant frequency and the opening rate are synchronous with this ultrasonic rate.

Flowing directions of the airflow and the air pulse are determined by a direction of the common mode movement S2 performed by the film structure FS (the flap pair FP). When the film structure FS (the flap pair FP) is actuated to move upwards (or downwards) for only performing one type of common mode movement S2 in the first step of the several periods, the types of the air-pressure differences in the first step of these periods are the same, thereby making the flowing directions of the air pulses generated in these periods (the third step) be the same. Thus, the airflow generating chip AFC shall produce single-ended (SE) air pulses or SE-liker air pulses. Also, the air pulse may be asymmetric.

In the present invention, a waveform of the SE air pulse or a waveform of the SE-liker air pulse may refer that the waveform is (substantially) unipolar with respect to certain level. For instance, the SE air pulse or the SE-liker air pulse may refer to the waveform which is (substantially) unipolar with respect to ambient pressure (e.g., 1 ATM). Namely, the SE air pulses or the SE-liker air pulses constitute a net air movement or a net airflow toward one single direction.

The airflow producing method of the present invention is not limited by the above. In one period of the airflow producing method, the number of the steps and the order of the actuating movements of the film structure FS (the flap pair FP) may be designed based on requirement(s).

In another aspect, for any common mode movements S2 of the flap pair FP, a pair of acoustic pressure waves will be produced, one in space on a side of the film structure FS, and one in space on an opposite side of the film structure FS. These two acoustic pressure waves will be of the same magnitude but of opposite polarities. As a result, when the vent opening OPV is opened, the air-pressure difference between the two air volumes in the vicinity of the vent opening OPV would neutralize each other. Therefore, when the timing of differential mode movement S3 reaching its peak (i.e., the timing which the vent opening OPV is maximum) is aligned to the timing of acceleration of common mode movement S2 reaching its peak, the acoustic pressure supposed to be generated by the common mode movement S2 shall be subdued/eliminated due to the opening of the vent opening OPV, causing the auto-neutralization between two acoustic pressures on the two opposite sides of the film structure FS, where the two acoustic pressures would have same magnitude but opposite polarities. It means, when the vent opening OPV is opened, the airflow generating chip AFC would produce (near) net-zero air pressure. Therefore, when the opened period of the vent opening OPV overlaps a time period of one of the (two) polarities of acceleration of common mode movement S2 of the flap pair FP, the airflow generating chip AFC shall produce SE air pulses or SE-liker air pulses.

Furthermore, by aligning the timing of opening of the vent opening OPV to the timing of acceleration of common mode movement S2 of the flap pair FP, the airflow generating chip AFC would be able to produce asymmetric air pulses.

In some embodiments, the film structure FS (the flap pair FP) may be actuated to perform the common mode movement S2 and the differential mode movement S3 simultaneously, but not limited thereto. In some embodiments, the film structure FS may include other part to make the common mode movement S2 and the differential mode movement S3 be performed by the film structure FS simultaneously, but not limited thereto.

In the present invention, the actuator AT may receive any suitable signal to actuate the film structure FS. In some embodiments, the film structure FS is actuated by a modulation-driving signal SM to perform the common mode movement S2 to form the air pressure variation, and the film structure FS is actuated by a demodulation-driving signal SV to perform the differential mode movement S3 to form the vent opening OPV, wherein both the modulation-driving signal SM and the demodulation-driving signal SV are related to an output amplitude of the air pulse.

Furthermore, a modulation frequency of the modulation-driving signal SM and a demodulation frequency of the demodulation-driving signal SV are related to the pulse rate of the air pulse. For example, the modulation frequency and the demodulation frequency may be synchronous with the pulse rate of the air pulse, such that the modulation frequency and the demodulation frequency may be synchronous with the pressure variant frequency of the air pressure variation, the opening rate of the vent opening OPV and the frequency of the period, but not limited thereto.

In some embodiments, the actuator AT may receive the modulation-driving signal SM and the demodulation-driving signal SV at different times, but not limited thereto. In some embodiments, the actuator AT may include a plurality sub-parts in the top view, one sub-part may receive the modulation-driving signal SM, and another sub-part may receive the demodulation-driving signal SV, but not limited thereto. In some embodiments, the actuator AT may include a first electrode and a second electrode, the first electrode may receive the modulation-driving signal SM, and the second electrode may receive the demodulation-driving signal SV, but not limited thereto.

Furthermore, by controlling the modulation-driving signal SM and/or the demodulation-driving signal SV, the flowing direction of the airflow (the air pulse) produced by the airflow generating chip AFC may be reversible. Details of which may be referred to U.S. application Ser. No. 18/624,105, which are not narrated herein for brevity.

The details of the airflow generating MEMS device (which may be fabricated by semiconductor process), i.e., the airflow generating chip AFC (e.g., the structure, the driving signal SM/SV and the movement) and their design/operational principles can be referred to U.S. Pat. No. 11,943,585, U.S. application Ser. Nos. 18/321,757 and 18/624,105 filed by same applicant. Thus, the contents of these US patents and US applications are incorporated herein by reference.

In some embodiments of the present invention, the airflow generating component may be the above airflow generating chip AFC, or the airflow generating component may be a component including the above airflow generating chip AFC. For example, the airflow generating component may be a semiconductor component with the above airflow generating chip AFC, an airflow generating package with the above airflow generating chip AFC or other component with the above airflow generating chip AFC, but not limited thereto. Some embodiments of the semiconductor component SC with the above airflow generating chip AFC are shown in FIG. 3 and FIG. 4, and some embodiments of the airflow generating package PG with the above airflow generating chip AFC are shown in FIG. 5 to FIG. 10, but the semiconductor component and the airflow generating package are not limited by the following embodiments.

In other words, the airflow generating chip AFC may be applied in all kinds of embodiments (e.g., airflow generating packages, semiconductor devices, electronic devices) stated in the present application or below, features and properties of the airflow generating chip AFC are included in the embodiments of the present application. Note that the semiconductor device is a kind of electronic device, wherein the semiconductor device may be or include the semiconductor component with the above airflow generating chip AFC, or the semiconductor device may be or include the airflow generating package with the above airflow generating chip AFC.

Figure 3:
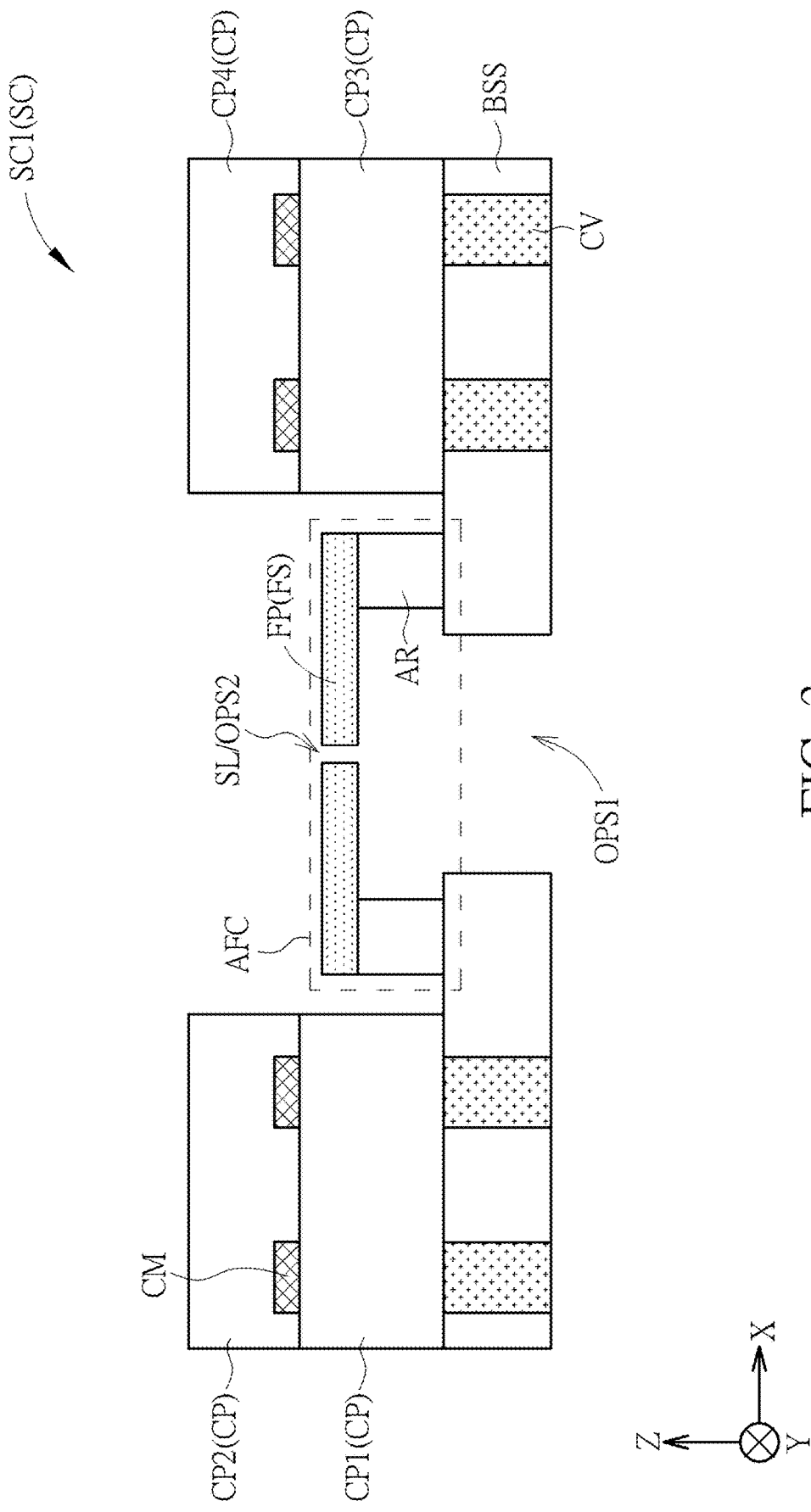
FIG. 3 is a schematic diagram of a cross sectional view illustrating a semiconductor component with the airflow generating chip according to an embodiment of the present invention.
Figure 4:
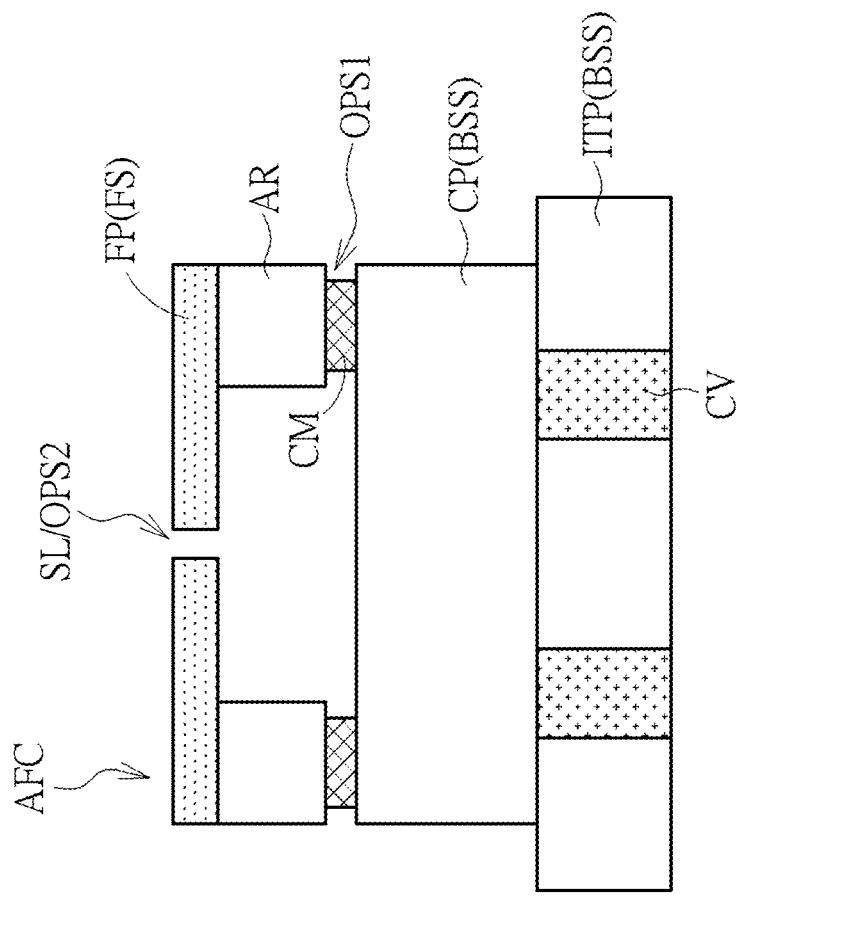
FIG. 4 is a schematic diagram of a cross sectional view illustrating a semiconductor component with the airflow generating chip according to another embodiment of the present invention.

Referring to FIG. 3, FIG. 3 is a schematic diagram of a cross sectional view illustrating a semiconductor component with the airflow generating chip according to an embodiment of the present invention. As shown in FIG. 3, the semiconductor component SC1 including the above airflow generating chip AFC may be formed by a semiconductor manufacturing process. For example, the semiconductor component SC1 may be a 2.5-dimensional (2.5D) integrated circuit or a three-dimensional (3D) integrated circuit (e.g., the semiconductor component SC1 shown in FIG. 3 is a 2.5D integrated circuit), but not limited thereto. For example, the semiconductor device including the semiconductor component SC1 may be or be disposed within a 2.5D semiconductor package, 3D semiconductor package or a chip-on-wafer-on-substrate (CoWoS) package.

In the semiconductor component SC1 shown in FIG. 3, the airflow generating chip AFC may be disposed on a base BSS of the semiconductor component SC1, wherein the base BSS of the semiconductor component SC1 may be a chip or an interposer (e.g., a wafer layer). For example, the base BSS may include silicon, germanium, any other suitable semiconductor material or a combination thereof. In FIG. 3, the base BSS may be an interposer (e.g., a silicon interposer), and a conductive structure CV (e.g., a through silicon via (TSV)) is disposed in the base BSS and configured to be electrically connected between two electronic elements disposed on two opposite sides of the base BSS, but not limited thereto.

In FIG. 3, the base BSS may have a top surface parallel to the direction X and the direction Y (i.e., the top surface of the base BSS may be a horizontal plane), and a normal direction of the top surface of the base BSS may be parallel to the direction Z.

The semiconductor component SC1 may further include at least one chip CP disposed on the base BSS and adjacent to the airflow generating chip AFC. In FIG. 3, the semiconductor component SC1 may include four chips CP1, CP2, CP3 and CP4, the chips CP1 and CP3 may be disposed on the base BSS, the chip CP2 may be disposed (stacked) on the chip CP1 and electrically connected to the chip CP1 through at least one connecting structure CM (e.g., a solder or a conductive ball), and the chip CP4 may be disposed (stacked) on the chip CP3 and electrically connected to the chip CP3 through at least one connecting structure CM (e.g., a solder or a conductive ball), but not limited thereto. Note that the airflow generating chip AFC may be used to dissipate the heat produced by the chip CP. Note that this connecting structure CM, such as the solder or the conductive ball, may help on dissipating the heat to increase the heat dissipation effect of the semiconductor component SC1 because this connecting structure CM may have heat conductive effect (i.e., the conductive ball may be also referred as a thermal conductive ball).

In the present invention, the semiconductor component SC1 may include at least one first air opening OPS1 and at least one second air opening OPS2, the airflow generated by the airflow generating chip AFC may pass through the first air opening OPS1 and the second air opening OPS2, wherein the airflow may flow into the semiconductor component SC1 through the first air opening OPS1 or the second air opening OPS2 (i.e., one of the first air opening OPS1 and the second air opening OPS2 may be an airflow inlet), and the airflow may flow out the semiconductor component SC1 through the first air opening OPS1 or the second air opening OPS2 (i.e., another of the first air opening OPS1 and the second air opening OPS2 may be an airflow outlet). In some embodiments, since the flowing direction of the airflow (the air pulse) produced by the airflow generating chip AFC is reversible, the airflow inlet and the airflow outlet is exchanged when the airflow (the air pulse) is reversed.

The first air opening(s) OPS1 and the second air opening(s) OPS2 may be designed based on requirement(s), and the number of the first air opening(s) OPS1 and the number of the second air opening(s) OPS2 may be designed based on requirement(s). For example, in FIG. 3, the semiconductor component SC1 may include one first air opening OPS1 and one second air opening OPS2, the base BSS may have the first air opening OPS1 overlapping the airflow generating chip AFC (i.e., the first air opening OPS1 is formed on a bottom of the airflow generating chip AFC), and the vent opening OPV (i.e., the slit SL) of the airflow generating chip AFC may be the second air opening OPS2 (i.e., the second air opening OPS2 is formed on a top of the airflow generating chip AFC), but not limited thereto.

Also, the design of the first air opening OPS1 and the second air opening OPS2 may be related to the path of the airflow in the semiconductor component SC1. For instance, a direction of the airflow passing through the first air opening OPS1 may be parallel or perpendicular to a direction of the airflow passing through the second air opening OPS2 (e.g., in FIG. 3, the direction of the airflow passing through the first air opening OPS1 may be parallel to the direction of the airflow passing through the second air opening OPS2), but not limited thereto.

Referring to FIG. 4, FIG. 4 is a schematic diagram of a cross sectional view illustrating a semiconductor component with the airflow generating chip according to another embodiment of the present invention. As shown in FIG. 4, a difference between this embodiment and the first embodiment shown in FIG. 3 is the type of the semiconductor component SC2 of this embodiment. For instance, in FIG. 4, the semiconductor component SC2 may be a 3D integrated circuit, such that the base BSS on which the airflow generating chip AFC is disposed (stacked) may be a chip CP and/or an interposer ITP, and the airflow generating chip AFC may be electrically connected to the chip CP through at least one connecting structure CM (e.g., a solder or a conductive ball), but not limited thereto. In FIG. 4, the connecting structure CM may be disposed between the airflow generating chip AFC and the chip CP.

Furthermore, the design of the first air opening OPS1 and the second air opening OPS2 of this embodiment is different from the embodiment shown in FIG. 3. For example, in FIG. 4, the first air opening OPS1 may be a space existing between the chip CP (the base BSS) and the airflow generating chip AFC and caused by the connecting structure CM (e.g., the first air opening OPS1 is behind the connecting structure CM in FIG. 4), the vent opening OPV (i.e., the slit SL) of the airflow generating chip AFC may be the second air opening OPS2, and the direction of the airflow passing through the first air opening OPS1 may be perpendicular to the direction of the airflow passing through the second air opening OPS2, but not limited thereto. Similarly, the first air opening OPS1 is formed on a bottom of the airflow generating chip AFC, and the second air opening OPS2 is formed on a top of the airflow generating chip AFC.

Figure 5:
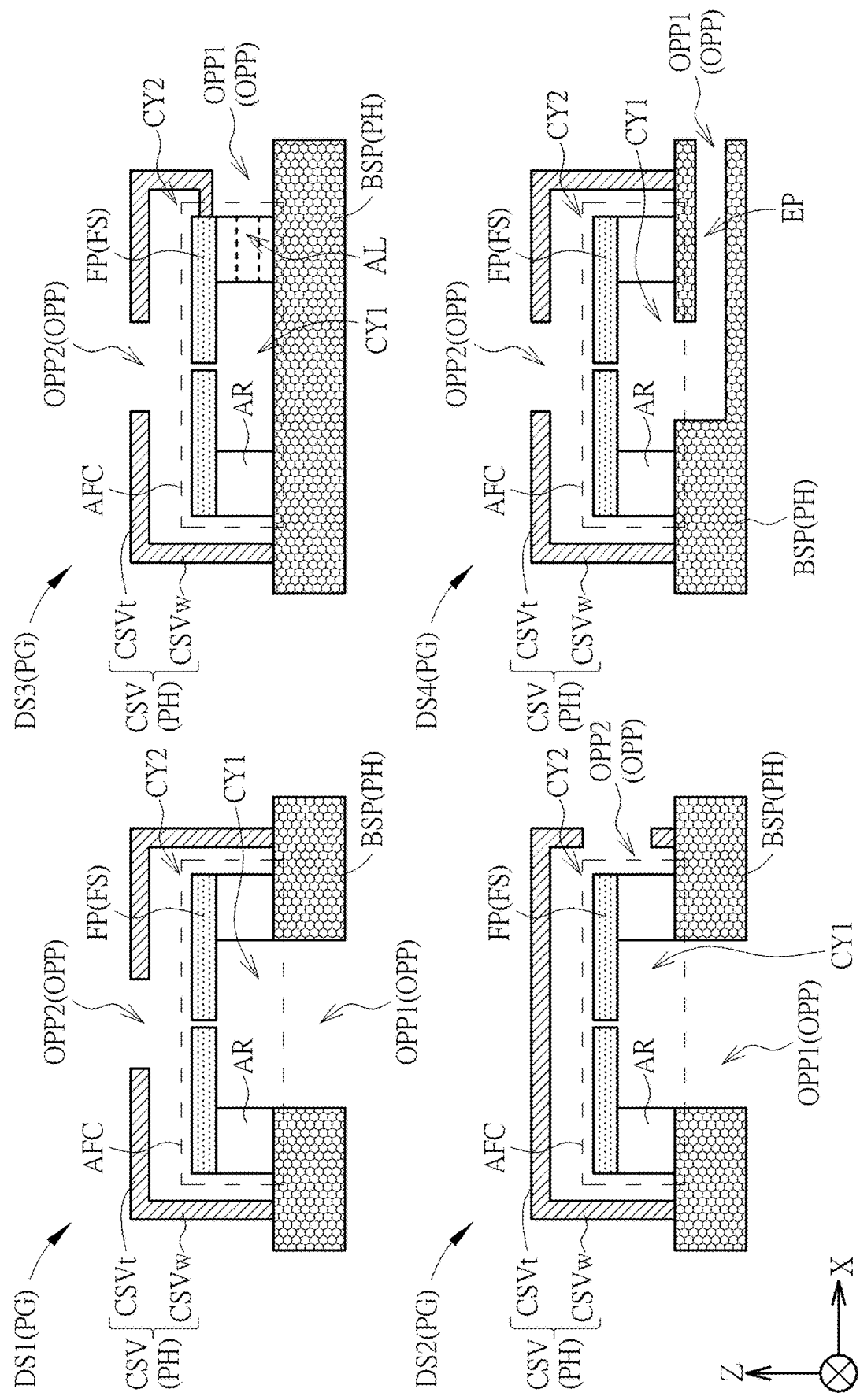
FIG. 5 is a schematic diagram of a cross sectional view illustrating four designs of an airflow generating package with the airflow generating chip according to embodiments of the present invention.

Referring to FIG. 5, FIG. 5 is a schematic diagram of a cross sectional view illustrating four designs of an airflow generating package with the airflow generating chip according to embodiments of the present invention. Note that the airflow generating chip AFC may be directly packaged in the airflow generating package PG (as shown in FIG. 5), or the airflow generating chip AFC may be a chip of the semiconductor component SC (the 2.5D integrated circuit shown in FIG. 3 or the 3D integrated circuit shown in FIG. 4) packaged in the airflow generating package PG, wherein the airflow generating package PG may be a kind of semiconductor device.

In the present invention, the airflow generating package PG may be or be applied in any suitable package to use any suitable manner to package the airflow generating chip AFC or the semiconductor component SC with the airflow generating chip AFC. For example, the airflow generating package PG may be or be applied in a chip scale package (CSP), a 2.5D semiconductor package, 3D semiconductor package, a CoWoS package, a ball grid array package (BGA package) or other suitable package, and the structure of the airflow generating package PG and the component(s) included in the airflow generating package PG may be corresponding to the type of the airflow generating package PG. For example (not shown in figures), the airflow generating chip AFC may be disposed in a flip-chip manner, but not limited thereto.

In the airflow generating package PG shown in FIG. 5, the airflow generating package PG includes a package housing PH in which the airflow generating chip AFC or the semiconductor component SC with the airflow generating chip AFC is disposed, such that the airflow generating package PG is protected by the package housing PH. Namely, the airflow generating chip AFC is packaged in the package housing PH. Note that a first cavity CY1 and a second cavity CY2 exist in the package housing PH and divided by the film structure FS of the airflow generating chip AFC.

As shown in FIG. 5, the package housing PH of the airflow generating package PG may include a base BSP, wherein the airflow generating chip AFC may be disposed on the base BSP, and the first cavity CY1 may exist between the base BSP and the film structure FS of the airflow generating chip AFC. The base BSP may be hard or flexible, wherein the base BSP may include glass, plastic, quartz, sapphire, metal, polymer (e.g., polyimide (PI), polyethylene terephthalate (PET)), any other suitable material or a combination thereof. As an example, the base BSP may be a circuit board including a laminate (e.g., copper clad laminate, CCL), a land grid array (LGA) board or any other suitable board containing conductive material, but not limited thereto.

In FIG. 5, the base BSP may have a top surface parallel to the direction X and the direction Y (i.e., the top surface of the base BSP may be a horizontal plane), and a normal direction of the top surface of the base BSP may be parallel to the direction Z.

In the present invention, the airflow generating chip AFC or the semiconductor component SC with the airflow generating chip AFC may be electrically connected to a conductive element in the base BSP through at least one connecting structure with conductive material. For example, the connecting structure may be a solder, a conductive ball (e.g., the conductive ball(s) is used in the BGA package) or other suitable structure, but not limited thereto. Note that this connecting structure, such as the solder or the conductive ball, may help on dissipating the heat to increase the heat dissipation effect of the airflow generating package PG because this connecting structure may have heat conductive effect.

As shown in FIG. 5, the package housing PH of the airflow generating package PG may include a covering structure CSV used to cover and protect the airflow generating chip AFC or the semiconductor component SC with the airflow generating chip AFC, wherein the second cavity CY2 may exist between the covering structure CSV and the film structure FS of the airflow generating chip AFC. In FIG. 5, the covering structure CSV may be disposed on the base BSP, and the airflow generating chip AFC may be disposed between the base BSP and the covering structure CSV. For example, the covering structure CSV may include glass, plastic, quartz, sapphire, metal, polymer, any other suitable material or a combination thereof (e.g., the covering structure CSV shown in FIG. 5 may include metal), or the covering structure CSV may be a metal lid.

In FIG. 5, the covering structure CSV may include a top part CSVt and at least one sidewall CSVw, wherein the sidewall CSVw is between the base BSP and the top part CSVt. For instance (as shown in FIG. 5), the covering structure CSV including the top part CSVt and the sidewall CSVw may be a one-piece structure (e.g., a cap), but not limited thereto. For instance (as shown in FIG. 5), the base BSP and the top part CSVt may be substantially parallel to each other, and the sidewall(s) CSVw may surround the airflow generating chip AFC, but not limited thereto.

In the present invention, the package housing PH of the airflow generating package PG may have a plurality of air openings OPP, and the airflow generated by the airflow generating chip AFC may pass through the air openings OPP. In some embodiments, the package housing PH may have at least one air opening OPP1 connected to the first cavity CY1 and at least one air opening OPP2 connected to the second cavity CY2, wherein the airflow may flow into the airflow generating package PG through the air opening OPP1 or the air opening OPP2 (i.e., one of the air opening OPP1 and the air opening OPP2 may be an airflow inlet), and the airflow may flow out the airflow generating package PG through the air opening OPP1 or the air opening OPP2 (i.e., another of the air opening OPP1 and the air opening OPP2 may be an airflow outlet). In some embodiments, since the flowing direction of the airflow (the air pulse) produced by the airflow generating chip AFC is reversible, the airflow inlet and the airflow outlet is exchanged when the airflow (the air pulse) is reversed.

In some embodiment(s), the base BSP and the covering structure CSV may be made of the same material. That is, the base BSP may be viewed as a part of the covering structure CSV, and vice versa. Both the base BSP and the covering structure CSV may be viewed as a part of package housing PH.

The air opening OPP may be formed on a top, a bottom or a sidewall of the package housing PH. In this embodiment, the air opening(s) OPP1 and the air opening(s) OPP2 may be designed based on requirement(s), and the number of the air opening(s) OPP1 and the number of the air opening(s) OPP2 may be designed based on requirement(s), wherein the design of the air opening(s) OPP1 and the air opening(s) OPP2 may be related to the path of the airflow in the airflow generating package PG. For instance, a direction of the airflow passing through the air opening OPP1 may be parallel or perpendicular to a direction of the airflow passing through the air opening OPP2, but not limited thereto. In the following, four designs of the airflow generating package PG shown in FIG. 5 are described.

In the first design DS1 of the airflow generating package PG shown in FIG. 5, the base BSP may have one air opening OPP1 overlapping the airflow generating chip AFC, and the top part CSVt of the covering structure CSV may have one air opening OPP2, such that the direction of the airflow passing through the air opening OPP1 may be parallel to the direction of the airflow passing through the air opening OPP2, but not limited thereto.

In the second design DS2 of the airflow generating package PG shown in FIG. 5, the base BSP may have one air opening OPP1 overlapping the airflow generating chip AFC, and the sidewall CSVw of the covering structure CSV may have one air opening OPP2, such that the direction of the airflow passing through the air opening OPP1 may be perpendicular to the direction of the airflow passing through the air opening OPP2, but not limited thereto.

In the third design DS3 of the airflow generating package PG shown in FIG. 5, the sidewall CSVw of the covering structure CSV may have one air opening OPP1, the airflow generating chip AFC (e.g., the anchor structure AR of the airflow generating chip AFC) may have an air channel AL connected between the air opening OPP1 and the first cavity CY1, and the top part CSVt of the covering structure CSV may have one air opening OPP2, such that the direction of the airflow passing through the air opening OPP1 may be perpendicular to the direction of the airflow passing through the air opening OPP2, but not limited thereto. Note that the airflow passes through the air channel AL when the airflow generating package PG is operated, and a flowing direction of the airflow in the air channel AL is perpendicular to the direction Z (e.g., the normal direction of the base BSP or the normal direction of the film structure FS).

In the fourth design DS4 of the airflow generating package PG shown in FIG. 5, a side surface of the base BSP may have one air opening OPP1, the base BSP may have an empty structure EP connected between the air opening OPP1 and the first cavity CY1, and the top part CSVt of the covering structure CSV may have one air opening OPP2, such that the direction of the airflow passing through the air opening OPP1 may be perpendicular to the direction of the airflow passing through the air opening OPP2, but not limited thereto. For instance, the empty structure EP may be an air channel (e.g., the structure shown in FIG. 6), a chamber (e.g., the structure shown in FIG. 7) or other suitable structure, but not limited thereto. Note that the airflow passes through the air channel (i.e., a kind of the empty structure EP) when the airflow generating package PG is operated, and a flowing direction of the airflow in the air channel is perpendicular to the direction Z (e.g., the normal direction of the base BSP or the normal direction of the film structure FS). Note that the airflow may or may not pass through the chamber (i.e., a kind of the empty structure EP) when the airflow generating package PG is operated.

In the present invention, the airflow generating package PG is not limited by four designs above shown in FIG. 5. FIG. 6 to FIG. 10 show some examples which are variants of the four designs above.

Figure 6:
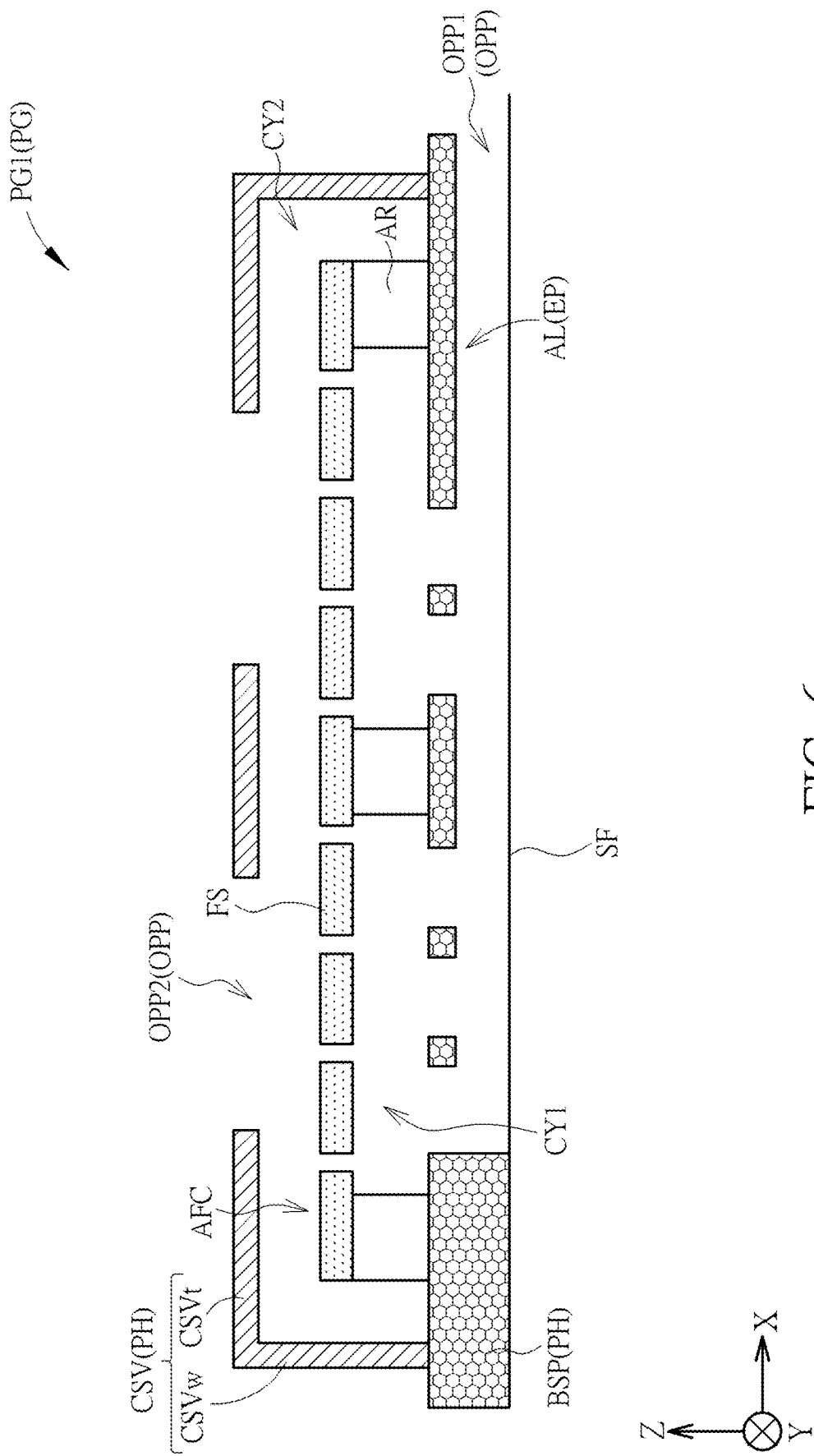
FIG. 6 is a schematic diagram of a cross sectional view illustrating an example of the fourth design of the airflow generating package with the airflow generating chip according to the present invention.

In FIG. 6 showing an exemplary variant of the fourth design DS4 of the airflow generating package PG1, the base BSP may have the empty structure EP which is the air channel AL and connected between the air opening OPP1 and the first cavity CY1. Furthermore, the top part CSVt of the covering structure CSV may have a plurality of air openings OPP2, but not limited thereto. Moreover, in FIG. 6, the airflow generating chip AFC may include a plurality of film structures FS, and each film structure FS may include a plurality of flap pairs FP (in one film structure FS shown in FIG. 6, three flaps FL respectively belonging to different three flap pairs FP are shown), so as to increase the airflow generated by the airflow generating chip AFC, but not limited thereto.

In FIG. 6, the airflow generating package PG1 may be disposed on or have direct contact with a surface SF of a heat source or a heat sink, and help on dissipating the heat of the heat source/sink.

Figure 7:
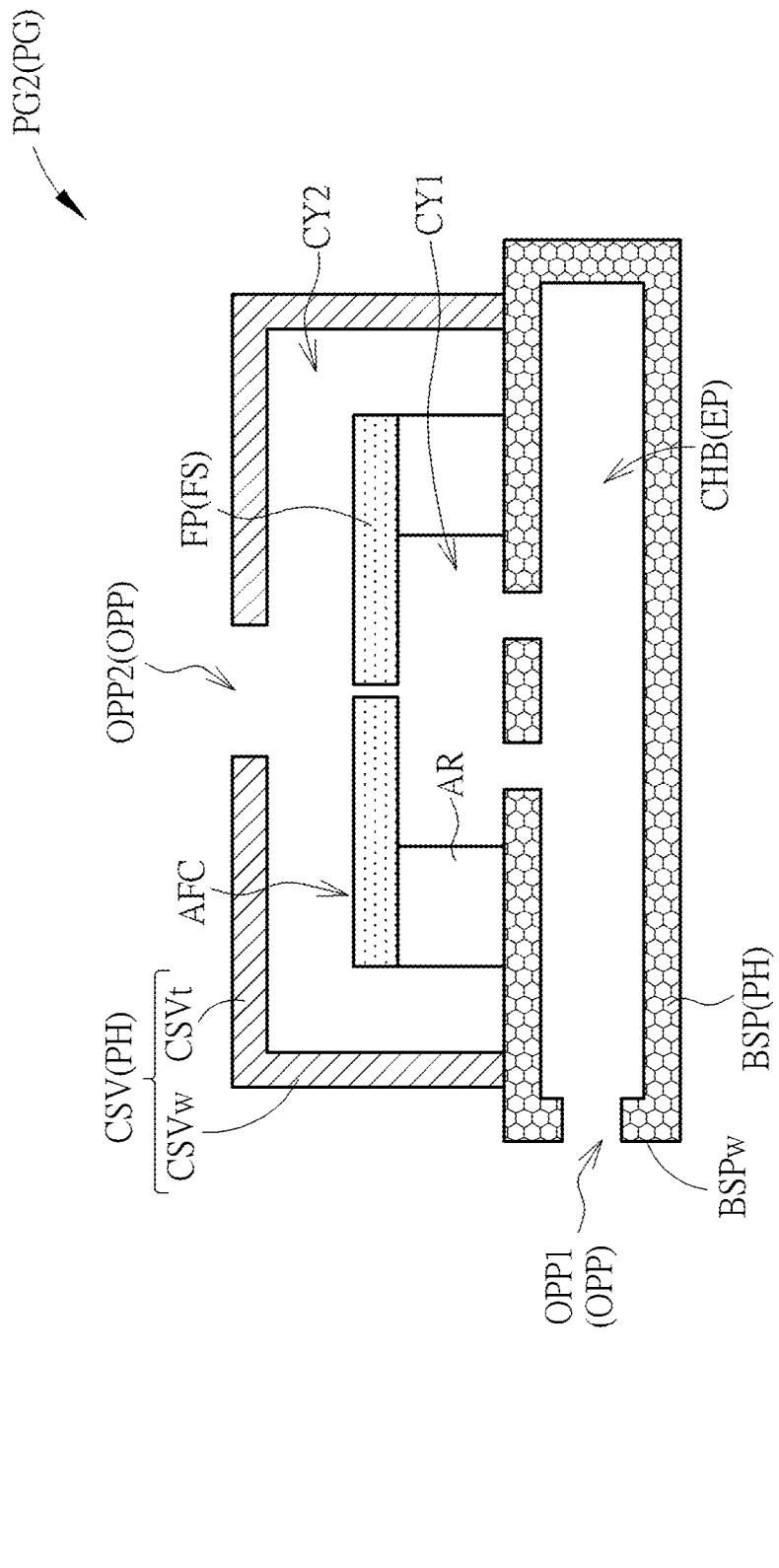
FIG. 7 is a schematic diagram of a cross sectional view illustrating another example of the fourth design of the airflow generating package with the airflow generating chip according to the present invention.

In FIG. 7 showing another exemplary variant of the fourth design DS4 of the airflow generating package PG2, the base BSP may have the empty structure EP which is the chamber CHB and connected between the air opening OPP1 and the first cavity CY1, so as to increase the airflow generated by the airflow generating chip AFC. For example, the base BSP may be a one-piece structure or may be formed of a plurality of sub-structures (e.g., a plurality of substrates). In FIG. 7, the empty structure EP (i.e., the chamber) is formed on a side of the film structure FS, and the air opening OPP1 is formed on the sidewall BSPw of the base BSP.

In other words, the airflow generating package PG2 may own a larger back volume because of the chamber CHB. By properly designing a size or dimension of the chamber CHB, a Helmholtz resonance (HHR) may be formed within the chamber CHB (or within the back volume of the airflow generating package PG2), where ultrasonic acoustic property may be obtained in the airflow generating package PG2 for more advantages in terms of producing airflow.

Figure 8:
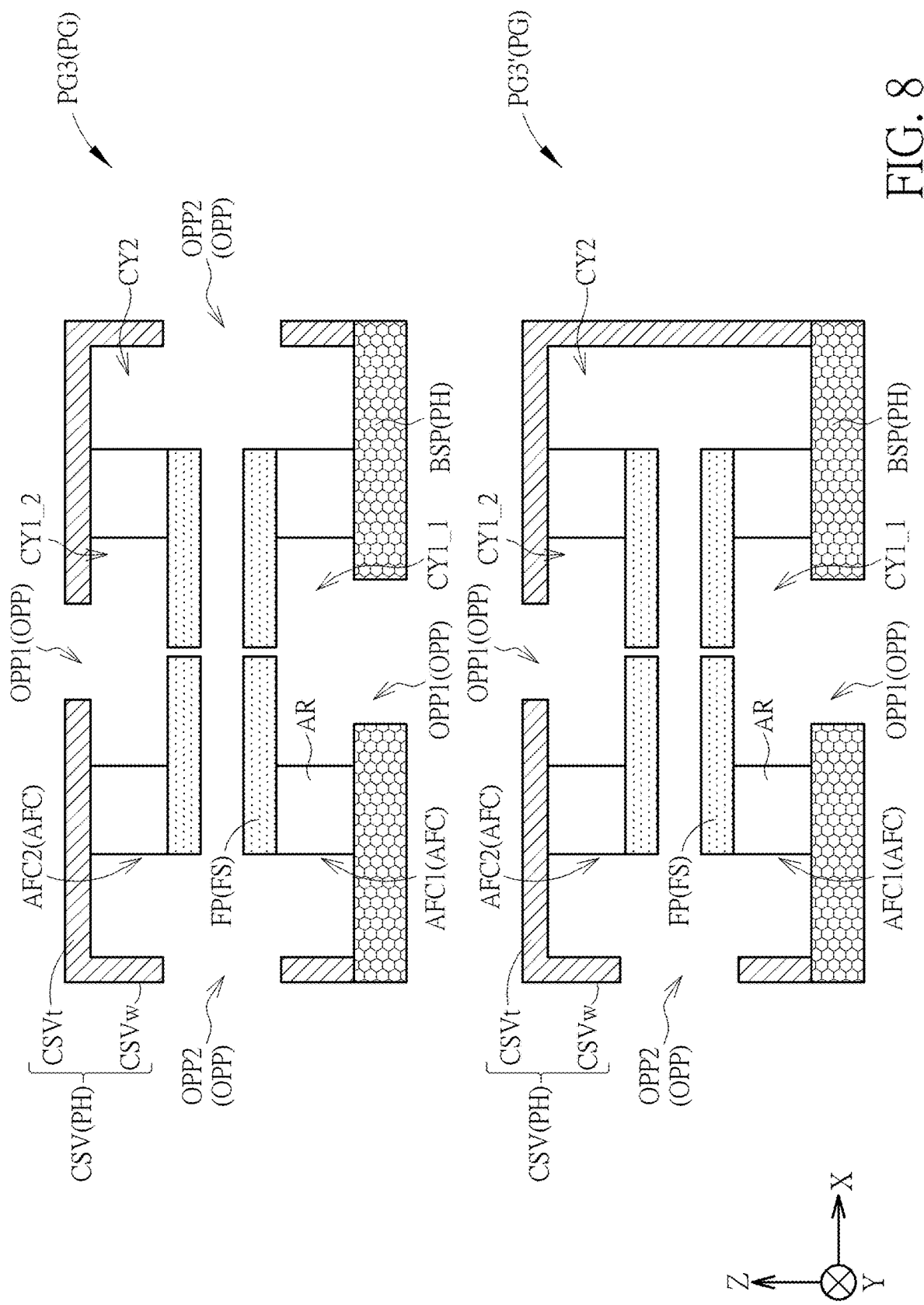
FIG. 8 is a schematic diagram of a cross sectional view illustrating examples of the second design of the airflow generating package with the airflow generating chip according to the present invention.

In FIG. 8 showing an exemplary variant of the second design DS2 of the airflow generating package PG3, the airflow generating package PG3 may have a plurality of airflow generating chips AFC1 and AFC2, wherein the airflow generating chip AFC1 may be connected to the base BSP, and the airflow generating chip AFC2 may be connected to the covering structure CSV. For instance, the airflow generating chips AFC1 and AFC2 may overlap in the direction Z (e.g., the airflow generating chips AFC1 and AFC2 may be stacked with each other), but not limited thereto. In FIG. 8, the first cavity CY1_1 may exist between the base BSP and the airflow generating chip AFC1, the first cavity CY1_2 may exist between the covering structure CSV and the airflow generating chip AFC2, and second cavity CY2 may exist between two airflow generating chips AFC1 and AFC2.

As shown in FIG. 8, the package housing PH may have a plurality air openings OPP1 connected to the first cavities CY1_1 and CY1_2 and a least one air opening OPP2 connected to the second cavity CY2. For instance, in the airflow generating package PG3, the base BSP may have one air opening OPP1 overlapping the airflow generating chip AFC1 and connected to the first cavity CY1_1, the top part CSVt of the covering structure CSV may have another air opening OPP1 overlapping the airflow generating chip AFC2 and connected to the first cavity CY1_2, and two sidewalls CSVw of the covering structure CSV may have two air openings OPP2 opposite to each other and connected to the second cavity CY2, such that the direction of the airflow passing through the air openings OPP1 may be perpendicular to the direction of the airflow passing through the air openings OPP2, but not limited thereto.

In FIG. 8 showing an exemplary variant of the second design DS2 of the airflow generating package PG3', compared with the airflow generating package PG3, the sidewall CSVw of the covering structure CSV of the airflow generating package PG3' may have one air opening OPP2, but not limited thereto.

In the airflow generating package PG3 and a variant of the airflow generating package PG3', the sidewall CSVw of the covering structure CSV may be the sidewall of the package housing PH, and the top part CSVt of the covering structure CSV and the base BSP may be the top and the bottom of the package housing PH respectively.

In (a variant of) the airflow generating package PG3 and (a variant of) the airflow generating package PG3', the flip-chip manner may be used in the airflow generating chip AFC1 and/or airflow generating chip AFC2. For example, one of the airflow generating chips AFC1 and AFC2 is disposed in a flip-chip manner, but not limited thereto.

In FIG. 8, having two or more airflow generating chips stacked, which would help on enlarging a total air volume of the airflow generated by the airflow generating package, is within the scope of the present application.

Figure 9:
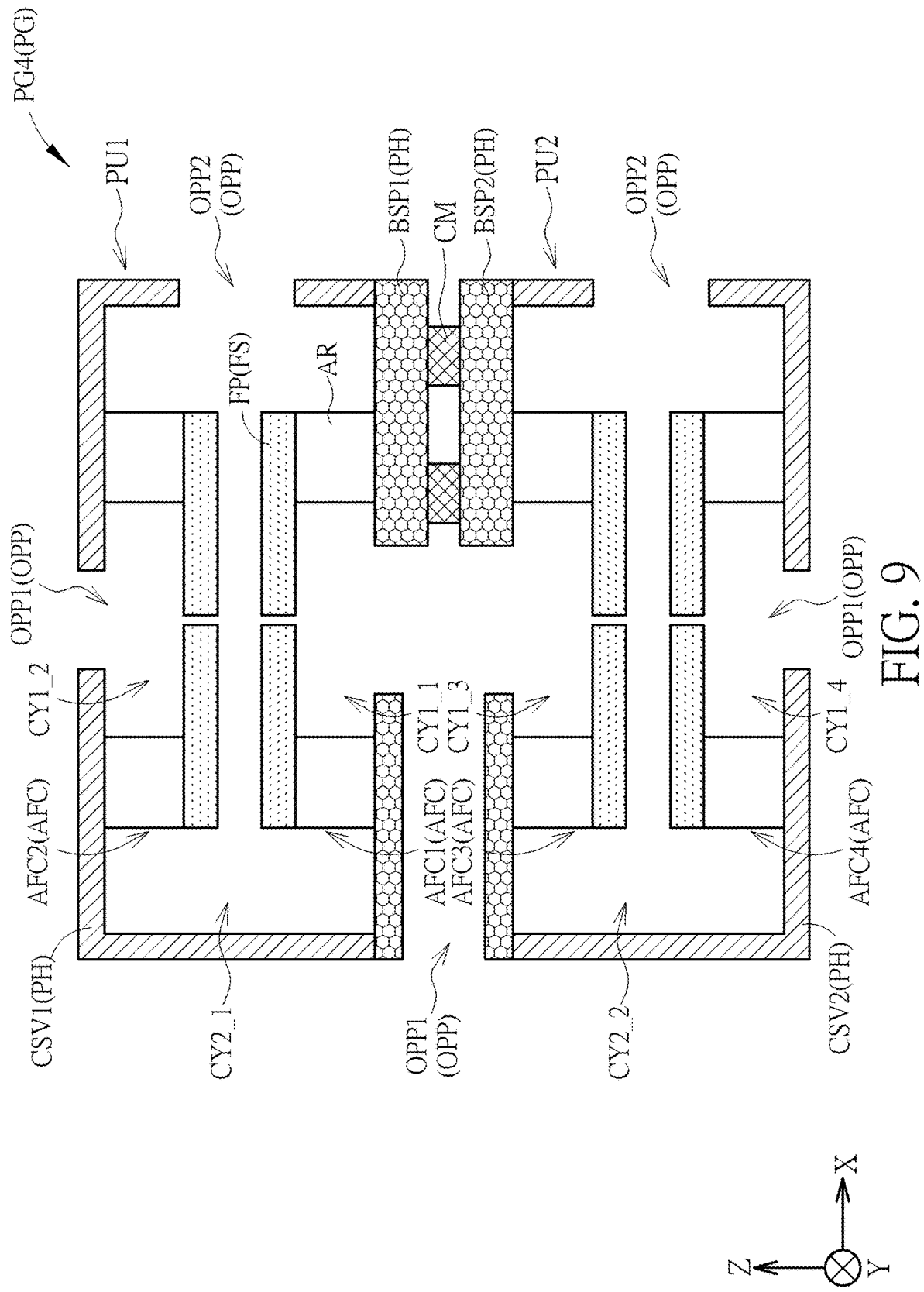
FIG. 9 is a schematic diagram of a cross sectional view illustrating another example of the second design of the airflow generating package with the airflow generating chip according to the present invention.

In FIG. 9 showing another exemplary variant of the second design DS2 of the airflow generating package PG4, the airflow generating package PG4 may have a plurality of package units PU1 and PU2 connected to each other, wherein the package unit PU1 may include at least one airflow generating chip AFC (e.g., two airflow generating chips AFC1 and AFC2 in FIG. 9), a base BSP1 and a covering structure CSV1, and the package unit PU2 may include at least one airflow generating chip AFC (e.g., two airflow generating chips AFC3 and AFC4 in FIG. 9), a base BSP2 and a covering structure CSV2. For example, the bases BSP1 and BSP2 may be between two covering structures CSV1 and CSV2, and a conductive element in the base BSP1 may be electrically connected to a conductive element in the base BSP2 through at least one connecting structure CM with conductive material (e.g., a solder or a conductive ball), but not limited thereto. In FIG. 9, the airflow generating chips AFC1, AFC2, AFC3 and AFC4 may overlap in the direction Z, but not limited thereto.

As shown in FIG. 9, the package housing PH may have a plurality air openings OPP1 connected to the first cavities CY1_1, CY1_2, CY1_3 and CY1_4 and a plurality of air openings OPP2 connected to the second cavities CY2_1 and CY2_2. For instance, one air opening OPP1 may exist between the bases BSP1 and BSP2 and be connected to the first cavities CY1_1 and CY1_3 (this air opening OPP1 is formed by thinning the bases BSP1 and BSP2), the covering structure CSV1 may have another air opening OPP1 overlapping the airflow generating chip AFC2 and connected to the first cavity CY1_2, the covering structure CSV2 may have still another air opening OPP1 overlapping the airflow generating chip AFC4 and connected to the first cavity CY1_4, the covering structure CSV1 may have one air opening OPP2 connected to the second cavity CY2_1, and the covering structure CSV2 may have another air opening OPP2 connected to the second cavity CY2_2, such that the direction of the airflow passing through one of the air openings OPP1 may be parallel or perpendicular to the direction of the airflow passing through the air openings OPP2, but not limited thereto. Accordingly, in FIG. 9, since the number of the airflow generating chips AFC is increased, the airflow generated by the airflow generating chips AFC is increased.

Figure 10:
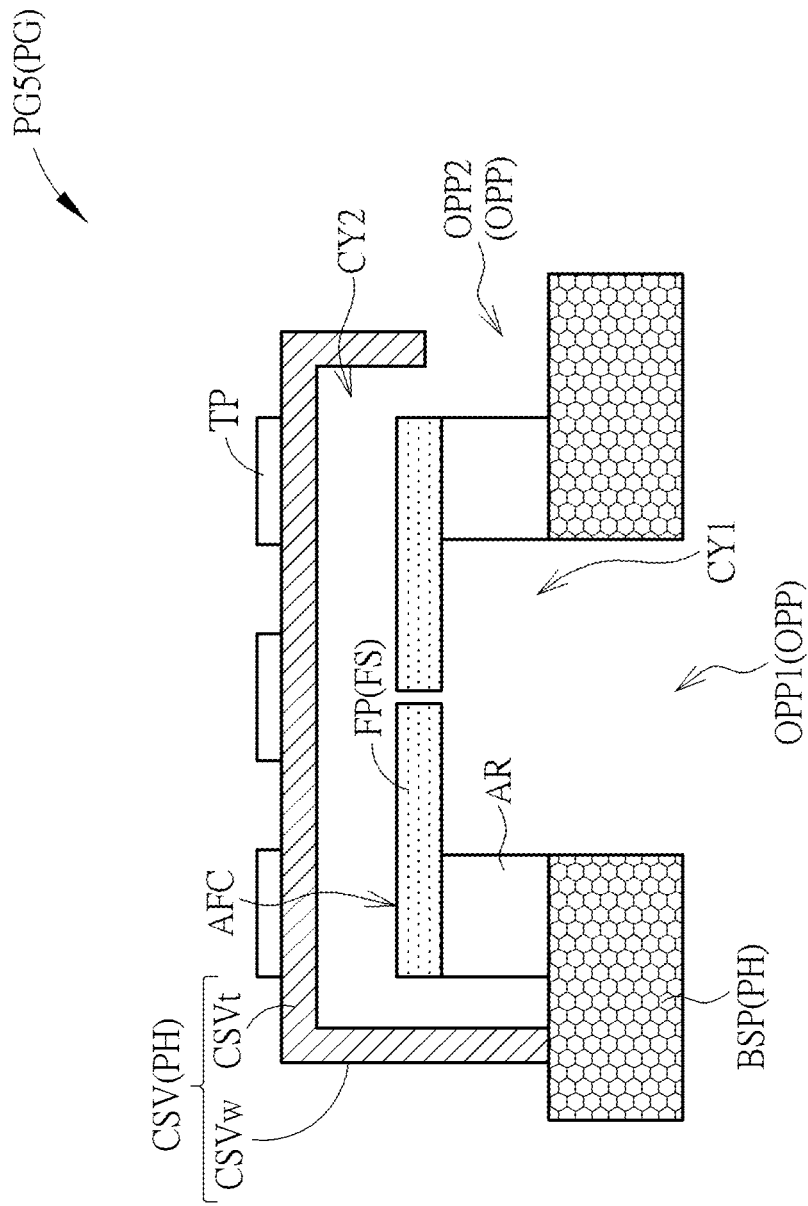
FIG. 10 is a schematic diagram of a cross sectional view illustrating still another example of the second design of the airflow generating package with the airflow generating chip according to the present invention.

In FIG. 10 showing still another exemplary variant of the second design DS2 of the airflow generating package PG5, the airflow generating package PG5 may further include a heat dissipating structure TP connected to the covering structure CSV, so as to enhance the effect of the heat dissipation caused by the airflow generating package PG5. In some embodiments, the heat dissipating structure TP may be disposed outside the covering structure CSV or inside the covering structure CSV (e.g., the heat dissipating structure TP may be disposed outside the covering structure CSV in FIG. 10). For example, in FIG. 10, the heat dissipating structure TP may have a plurality of heat dissipating units distributed over the covering structure CSV, but not limited thereto. In some embodiments, the heat dissipating structure TP and/or the heat dissipating unit of the heat dissipating structure TP may be a notch or a convex (or a protrusion) of the covering structure CSV (e.g., the heat dissipating structure TP and the covering structure CSV may form a one-piece structure shown in FIG. 28), or the heat dissipating structure TP and/or the heat dissipating unit of the heat dissipating structure TP may be adhered to the covering structure CSV (e.g., the heat dissipating structure TP and/or the heat dissipating unit of the heat dissipating structure TP may be a heat sink, a heat spreader, etc.).

In the present invention, the airflow generating component (e.g., the airflow generating chip AFC, the semiconductor component SC with the airflow generating chip AFC or the airflow generating package PG with the airflow generating chip AFC) may be used in a device DV, such that the airflow generated by the airflow generating component (i.e., the airflow generating chip AFC) may dissipate the heat generated by the component(s) in this device DV. Accordingly, the heat dissipation of the device DV may be improved by the airflow caused by the airflow generating component. For example, the device DV may be an electronic device (such as a smartphone, a tablet or other suitable electronic device). Some embodiments of the devices DV with the airflow generating component are shown in FIG. 11 to FIG. 17, wherein the airflow generating component shown in FIG. 11 to FIG. 17 is the airflow generating package PG with the airflow generating chip AFC, but the device DV is not limited by the following embodiments.

Figure 11:
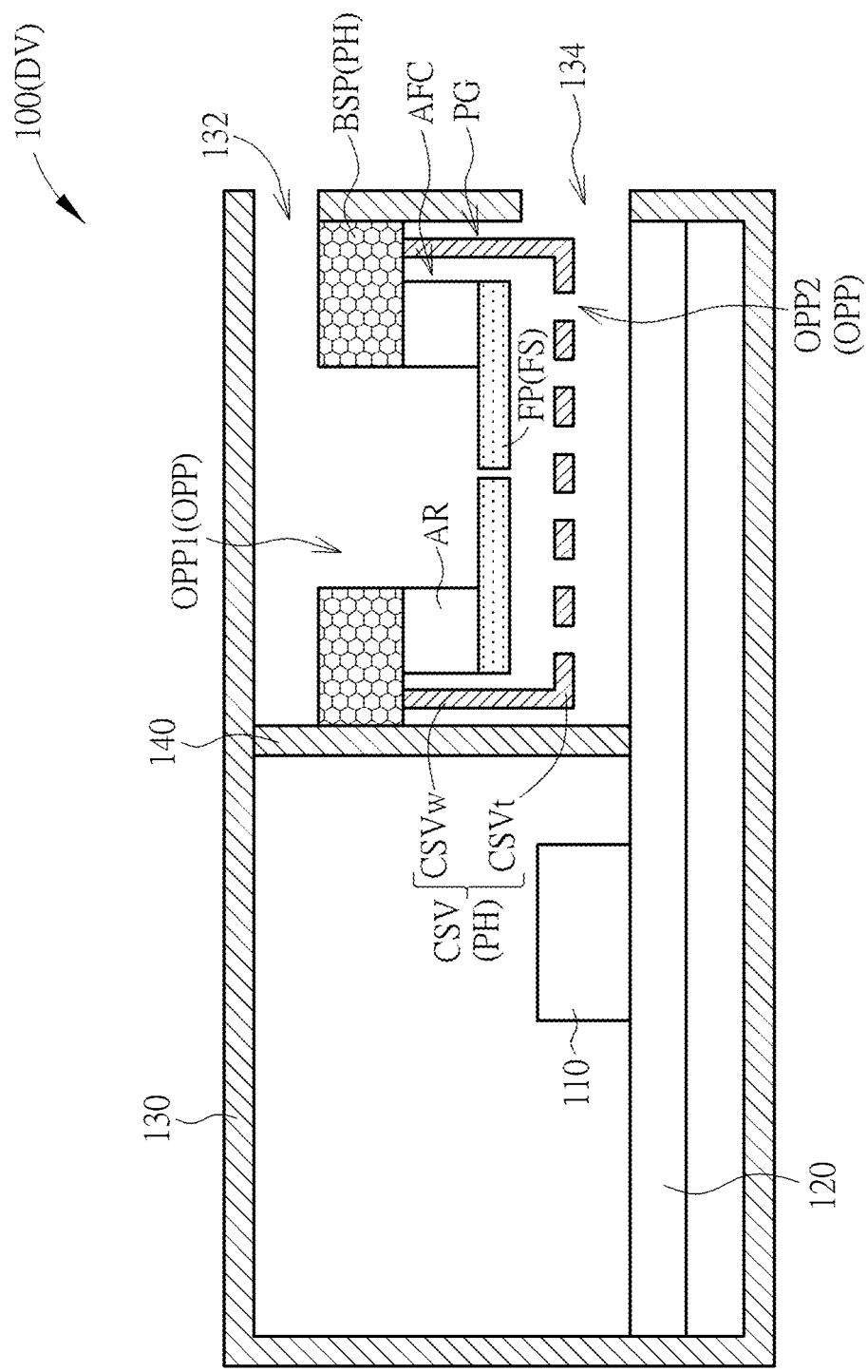
FIG. 11 is a schematic diagram of a cross sectional view illustrating a device with a heat source and the airflow generating chip according to a first embodiment of the present invention.

Referring to FIG. 11, FIG. 11 is a schematic diagram of a cross sectional view illustrating a device with a heat source and the airflow generating chip according to a first embodiment of the present invention. In FIG. 11, the airflow generating package PG shown in FIG. 11 may a variant belonging to the first design DS1 shown in FIG. 5, wherein the base BSP may have one air opening OPP1, and the top part CSVt of the covering structure CSV may have a plurality of air openings OPP2, such that the direction of the airflow passing through the air opening OPP1 may be parallel to the direction of the airflow passing through the air opening OPP2, but not limited thereto.

As shown in FIG. 11, the device 100 includes a heat source (or an operational component) 110, wherein the heat source (operational component) 110 generates heat while operating, and the airflow generating package PG in the device 100 is configured to generate the airflow to dissipate the heat generated by the heat source 110. In the present invention, the heat source 110 may be any suitable component which can generate the heat while operating. For example, the heat source 110 may be an operational component (i.e., the operational component may be referred as a heat generating chip) formed by a semiconductor manufacturing process, wherein the operational component may be a chip, a 2.5D integrated circuit, a 3D integrated circuit, but not limited thereto. For example, the operational component may be or comprise an application processor (AP), a central processing unit (CPU), a graphic processing unit (GPU), a tensor processing unit (TPU), generally an XPU, or a memory, but not limited thereto. For instance, a normal direction of a top surface of the heat source 110 may be parallel to the direction Z, but not limited thereto.

In the present invention, the label "110" may be employed to denote heat source, heat generating chip and operational component. The terms "heat source", "heat generating chip" and "operational component" are used interchangeably.

As shown in FIG. 11, the device 100 may include a heat conductive component 120 disposed adjacent to the heat source 110 and configured to conduct a heat generated by the heat source 110. For example, the heat source 110 may be connected to the heat conductive component 120, so as to enhance the heat dissipating effect (e.g., the heat dissipating efficiency). The heat conductive component 120 may be any suitable component for conducting the heat. For instance, the heat conductive component 120 may include a heat sink, a heat spreader, a thermal interface material, an interposer, a heat pipe, a vapor chamber, other suitable component or a combination thereof (e.g., the heat conductive component 120 shown in FIG. 11 may be a heat spreader), but not limited thereto.

As shown in FIG. 11, the airflow generating package PG (i.e., the airflow generating component) may be disposed adjacent to the heat conductive component 120, such that the heat generated by the heat source 110 may be dissipated by the heat conductive component 120 and the airflow produced by the airflow generating package PG. In some embodiments, the airflow generating package PG may be disposed on or over the heat source 110 and/or the heat conductive component 120, such that the film structure FS of the airflow generating package PG may generate the airflow to dissipate the heat from the heat source 110 and/or the heat conductive component 120. For example, in FIG. 11, the airflow generating package PG may be disposed on and overlap the heat conductive component 120, but not limited thereto. For example, in FIG. 11, the film structure FS of the airflow generating package PG may face the heat conductive component 120. For example, in FIG. 11, the covering structure CSV of the airflow generating package PG may be disposed between the heat conductive component 120 and the film structure FS, but not limited thereto. For example, in FIG. 11, the heat source 110 and the airflow generating package PG may be disposed on a same side of the heat conductive component 120.

In this embodiment, the heat generated by the heat source 110 may be conducted and dissipated by the heat conductive component 120 firstly, and then, the airflow produced by the airflow generating package PG may cause the cold air to flow into the device 100 and cause the hot air to flow out the device 100 for dissipating the heat of the heat conductive component 120. In FIG. 11, the airflow generating package PG may be configured to dissipate the heat of a portion of the heat conductive component 120 overlapping the airflow generating package PG, but not limited thereto.

As shown in FIG. 11, the device 100 may include an outer casing 130 in which the heat source 110, the heat conductive component 120 and the airflow generating package PG (i.e., the airflow generating component) are disposed, such that the heat conductive component 120 and the airflow generating package PG may be protected by the outer casing 130. In FIG. 11, the outer casing 130 may be an outermost structure of the device 100.

In this embodiment, the heat conductive component 120 may disposed in a wide range in the outer casing 130, so as to enhance the heat dissipating effect of the heat conductive component 120. Furthermore, because of the existence of the heat conductive component 120, the design of the positions of the heat source 110 and the airflow generating package PG is flexible. For example, in FIG. 11, the heat source 110 and the airflow generating package PG may be disposed in different regions in the outer casing 130 and not overlapped in the direction Z (e.g., the heat source 110 and the airflow generating package PG may be separated by a spacer 140 in FIG. 11), and the heat generated by the heat source 110 may be still dissipated by the airflow generating package PG through the heat conductive component 120, but not limited thereto. Note that, the spacer 140 separating the airflow generating package PG and the heat source 110 may present the airflow (direction) from being too diverse, which may help on enhancing efficiency and efficacy of heat dissipation. For example, in FIG. 11, the airflow generating package PG may be disposed by (or disposed adjacent to) an edge of the device 100, and the heat conductive component 120 may extend from the heat source 110 toward the airflow generating package PG, such that the airflow generated by the airflow generating package PG may flow through the heat conductive component 120.

In FIG. 11, the outer casing 130 may include at least one first casing opening 132 related to the air opening OPP1 and at least one second casing opening 134 related to the air opening OPP2, the airflow generated by the airflow generating chip AFC in the airflow generating package PG may pass through the first casing opening 132 and the second casing opening 134, wherein the airflow may flow into the device 100 through the first casing opening 132 or the second casing opening 134 (i.e., one of the first casing opening 132 and the second casing opening 134 may be a device airflow inlet), the airflow may flow out the device 100 through the first casing opening 132 or the second casing opening 134 (i.e., another of the first casing opening 132 and the second casing opening 134 may be a device airflow outlet), and the first casing opening 132 and the second casing opening 134 are disposed by the same edge or different edges of the device 100. Since the flowing direction of the airflow produced by the airflow generating chip AFC in the airflow generating package PG is reversible, the device airflow inlet and the device airflow outlet is exchanged when the airflow is reversed.

In a first flowing direction of the airflow in the device 100, the airflow passes through the first casing opening 132, the air opening OPP1, the film structure FS of the airflow generating chip AFC, the air opening OPP2 and the second casing opening 134 in sequence. In a second flowing direction of the airflow in the device 100, the airflow passes through the second casing opening 134, the air opening OPP2, the film structure FS of the airflow generating chip AFC, the air opening OPP1 and the first casing opening 132 in sequence.

The first casing opening(s) 132 and the second casing opening(s) 134 may be designed based on requirement(s), and the number of the first casing opening(s) 132 and the number of the second casing opening(s) 134 may be designed based on requirement(s), wherein the design of the first casing opening(s) 132 and the second casing opening(s) 134 may be related to the path of the airflow in the device 100. For instance, a direction of the airflow passing through the first casing opening 132 may be parallel or perpendicular to a direction of the airflow passing through the second casing opening 134 (in FIG. 11, the direction of the airflow passing through the first casing opening 132 may be parallel to the direction of the airflow passing through the second casing opening 134), but not limited thereto.

The direction of the airflow passing through the air opening OPP1, the direction of the airflow passing through the air opening OPP2, the direction of the airflow passing through the first casing opening 132 and the direction of the airflow passing through the second casing opening 134 may be designed based on requirement(s). For instance, the direction of the airflow passing through the air opening OPP1 and the direction of the airflow passing through the air opening OPP2 may be perpendicular to the direction of the airflow passing through the first casing opening 132 and the direction of the airflow passing through the second casing opening 134, but not limited thereto.

Figure 12:
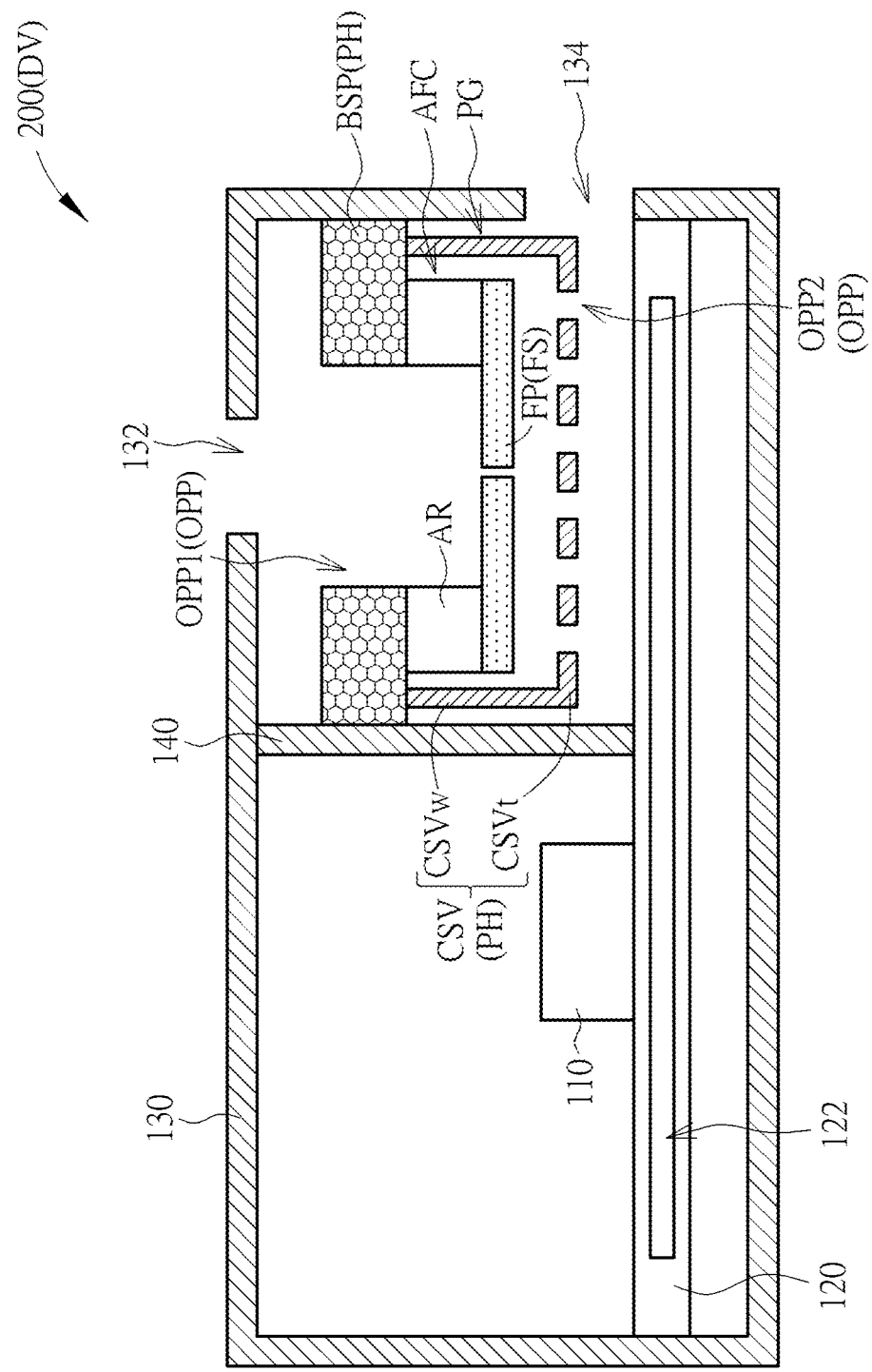
FIG. 12 is a schematic diagram of a cross sectional view illustrating a device with the heat source and the airflow generating chip according to a second embodiment of the present invention.

Referring to FIG. 12, FIG. 12 is a schematic diagram of a cross sectional view illustrating a device with the heat source and the airflow generating chip according to a second embodiment of the present invention, wherein the airflow generating package PG shown in FIG. 12 may a variant belonging to the first design DS1 shown in FIG. 5. As shown in FIG. 12, a difference between this embodiment and the embodiment shown in FIG. 11 is the type of the heat conductive component 120 of the device 200. In FIG. 12, the heat conductive component 120 may be a heat pipe or a vapor chamber, wherein a space 122 filled with the liquid and/or gas exists in the heat conductive component 120.

As shown in FIG. 12, another difference between this embodiment and the embodiment shown in FIG. 11 is the position of the first casing opening 132. Thus, the direction of the airflow passing through the air opening OPP1, the direction of the airflow passing through the air opening OPP2 and the direction of the airflow passing through the first casing opening 132 may be perpendicular to the direction of the airflow passing through the second casing opening 134, but not limited thereto.

Figure 13:
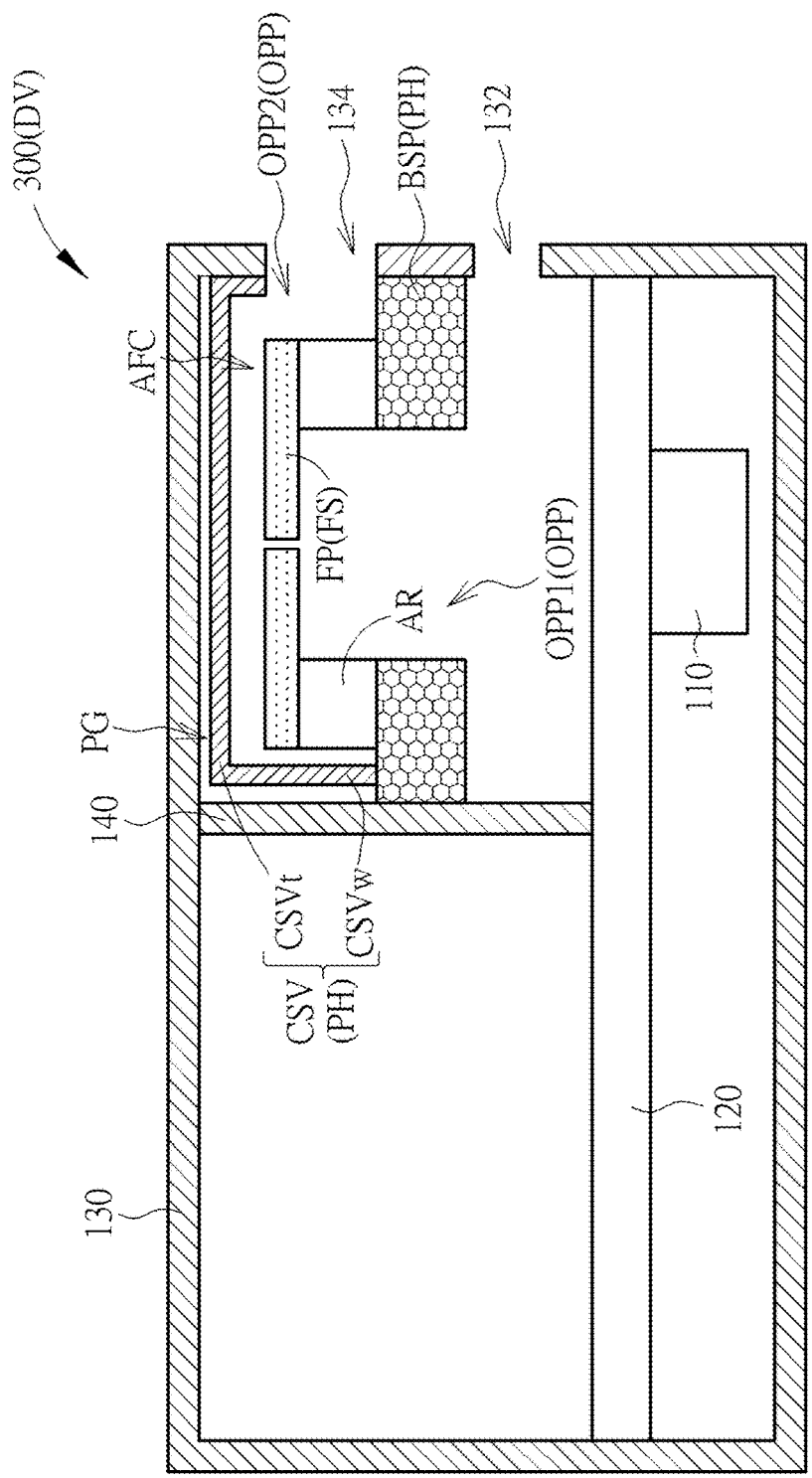
FIG. 13 is a schematic diagram of a cross sectional view illustrating a device with the heat source and the airflow generating chip according to a third embodiment of the present invention.

Referring to FIG. 13, FIG. 13 is a schematic diagram of a cross sectional view illustrating a device with the heat source and the airflow generating chip according to a third embodiment of the present invention, wherein the airflow generating package PG shown in FIG. 13 may belong to the second design DS2 shown in FIG. 5. As shown in FIG. 13, a difference between this embodiment and the embodiment shown in FIG. 11 is the position of the heat source 110 of the device 300. In FIG. 13, the heat source 110, the heat conductive component 120 and the airflow generating package PG (i.e., the airflow generating component) may be overlapped in the direction Z, and the heat conductive component 120 may be disposed between the heat source 110 and the airflow generating package PG in the direction Z. Furthermore, in FIG. 13, the base BSP of the airflow generating package PG may be disposed between the heat conductive component 120 and the film structure FS, but not limited thereto.

Figure 14:
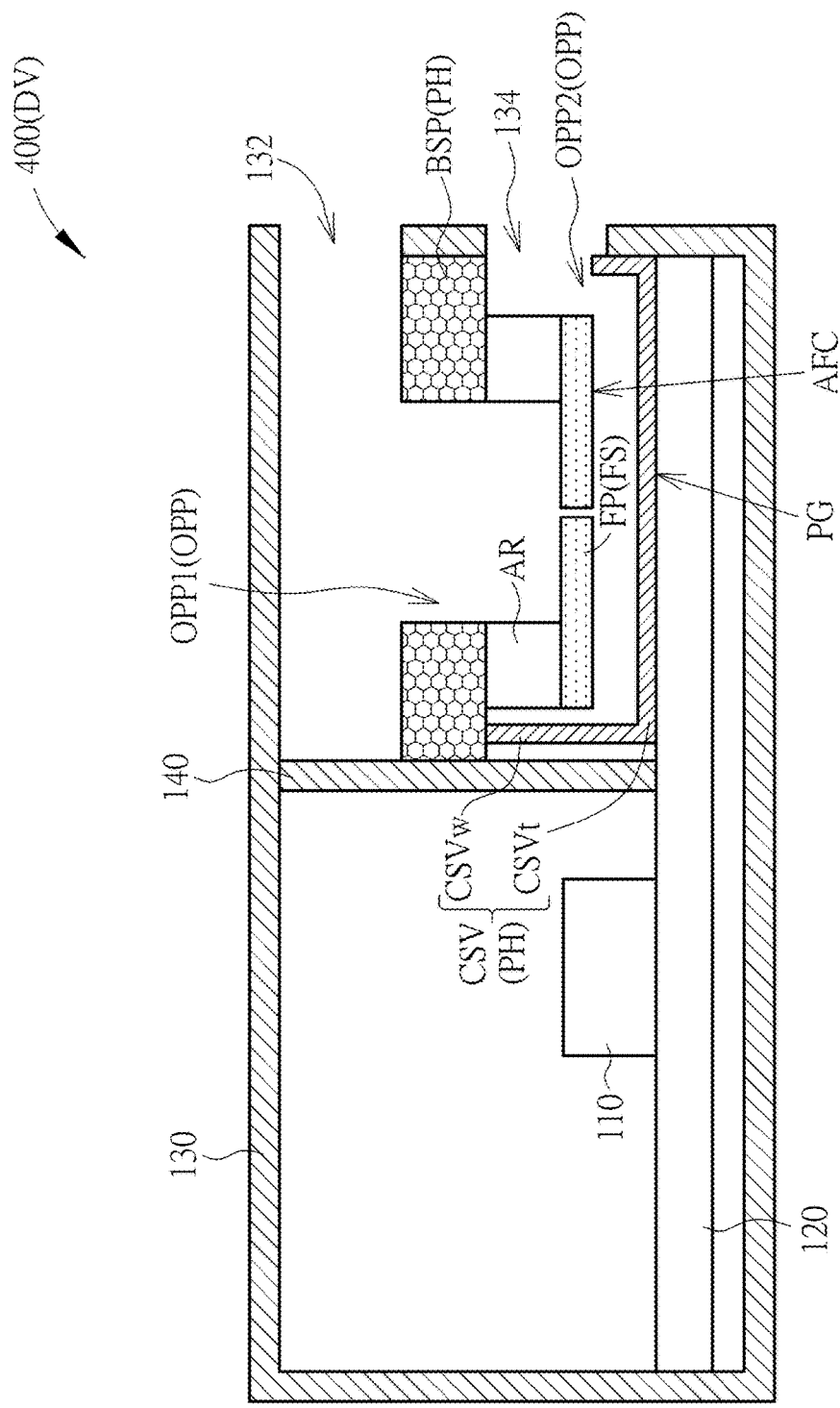
FIG. 14 is a schematic diagram of a cross sectional view illustrating a device with the heat source and the airflow generating chip according to a fourth embodiment of the present invention.

Referring to FIG. 14, FIG. 14 is a schematic diagram of a cross sectional view illustrating a device with the heat source and the airflow generating chip according to a fourth embodiment of the present invention, wherein the airflow generating package PG shown in FIG. 14 may belong to the second design DS2 shown in FIG. 5. As shown in FIG. 14, a difference between this embodiment and the embodiment shown in FIG. 11 is that the heat conductive component 120 is connected to the covering structure CSV of the airflow generating package PG of the device 400, such that the heat of the heat conductive component 120 is directly conducted to the airflow generating package PG. For instance, the heat conductive component 120 may be adhered to the covering structure CSV of the airflow generating package PG, e.g., via some material with high heat conductive coefficient such as thermal interface material (TIM) (not shown in FIG. 14), but not limited thereto. Thermal interface material (TIM) may be or comprises thermal grease, thermal gel, thermal pad, phase change material (PCM), phase change metal alloy (PCMA), thermal conductive adhesive, but not limited thereto.

Figure 15:
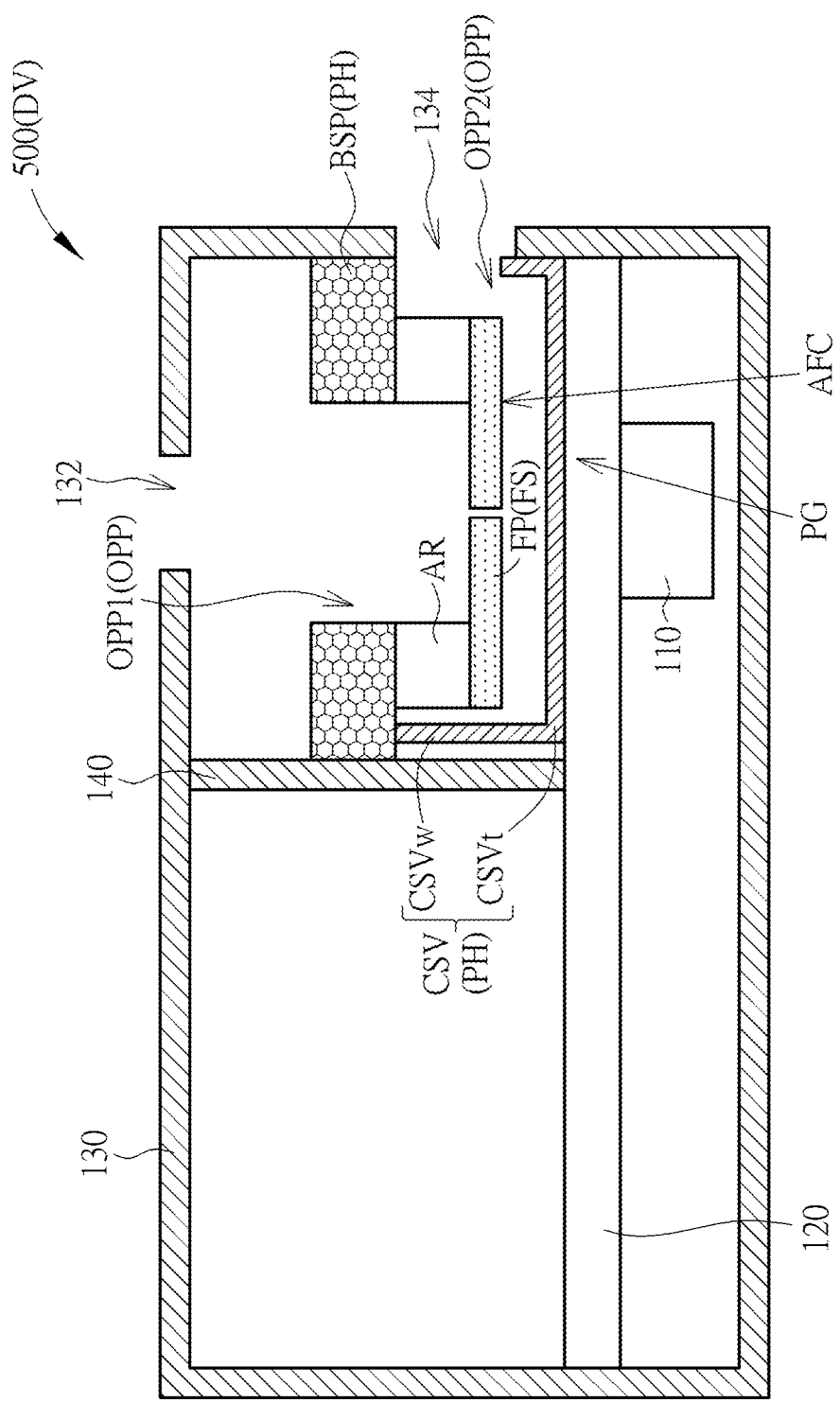
FIG. 15 is a schematic diagram of a cross sectional view illustrating a device with the heat source and the airflow generating chip according to a fifth embodiment of the present invention.

Referring to FIG. 15, FIG. 15 is a schematic diagram of a cross sectional view illustrating a device with the heat source and the airflow generating chip according to a fifth embodiment of the present invention, wherein the airflow generating package PG shown in FIG. 15 may belong to the second design DS2 shown in FIG. 5. As shown in FIG. 15, a difference between this embodiment and the embodiment shown in FIG. 14 is the position of the heat source 110 of the device 500. In FIG. 15, the heat source 110, the heat conductive component 120 and the airflow generating package PG (i.e., the airflow generating component) may be overlapped in the direction Z, and the heat conductive component 120 may be disposed between the heat source 110 and the airflow generating package PG in the direction Z.

As shown in FIG. 15, another difference between this embodiment and the embodiment shown in FIG. 14 is the position of the first casing opening 132 of the device 500. Thus, the direction of the airflow passing through the air opening OPP1, the direction of the airflow passing through the air opening OPP2 and the direction of the airflow passing through the first casing opening 132 may be perpendicular to the direction of the airflow passing through the second casing opening 134, but not limited thereto.

Figure 16:
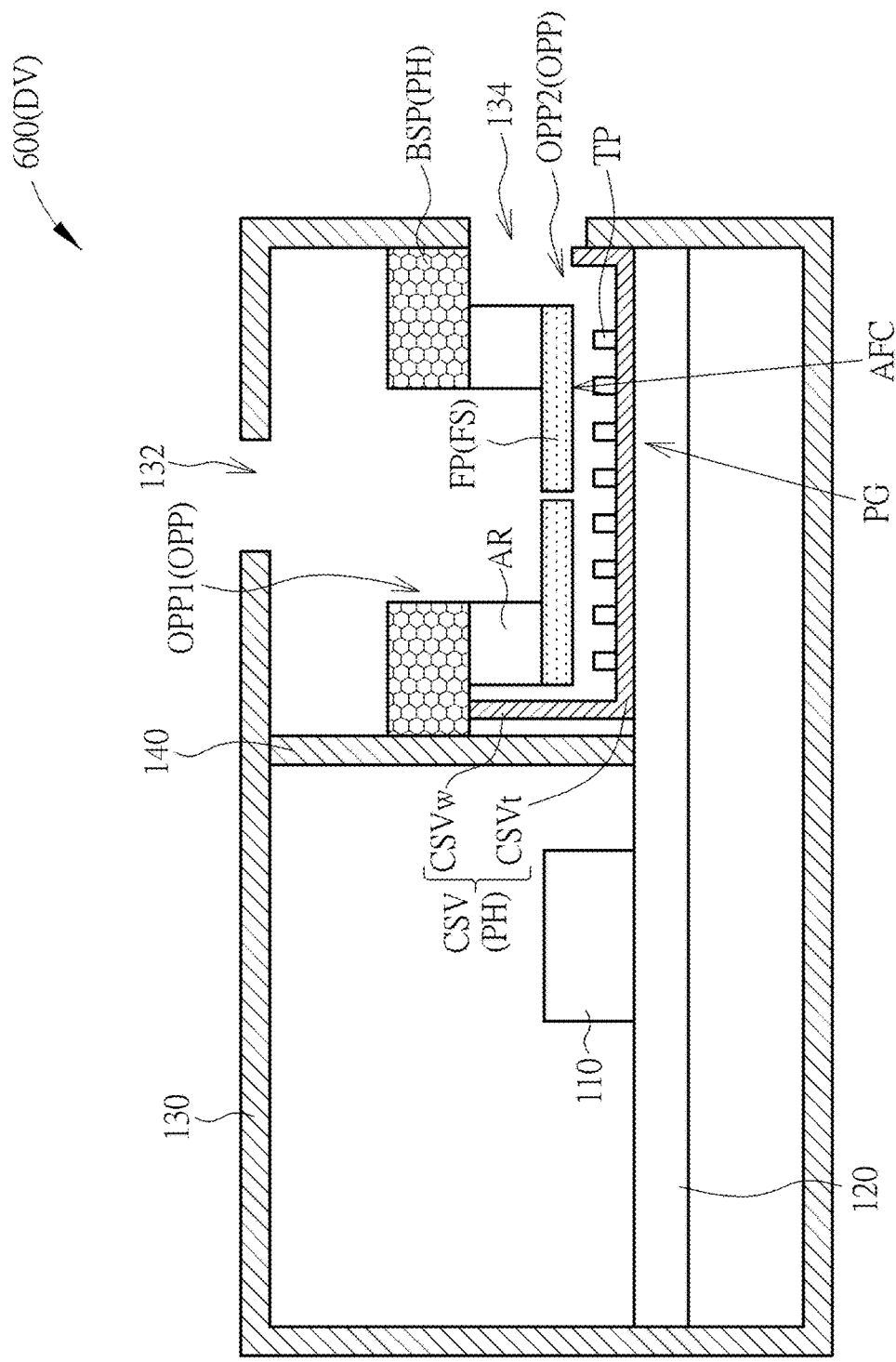
FIG. 16 is a schematic diagram of a cross sectional view illustrating a device with the heat source and the airflow generating chip according to a sixth embodiment of the present invention.

Referring to FIG. 16, FIG. 16 is a schematic diagram of a cross sectional view illustrating a device with the heat source and the airflow generating chip according to a sixth embodiment of the present invention, wherein the airflow generating package PG shown in FIG. 16 may belong to the second design DS2 shown in FIG. 5. As shown in FIG. 16, a difference between this embodiment and the embodiment shown in FIG. 15 is that the airflow generating package PG of the device 600 includes a heat dissipating structure TP connected to the covering structure CSV, wherein the heat dissipating structure TP is disposed inside the covering structure CSV, so as to enhance the effect of the heat dissipation caused by the airflow generating package PG. For example, in FIG. 16, the heat dissipating structure TP may have a plurality of heat dissipating units distributed over the covering structure CSV, but not limited thereto.

Figure 17:
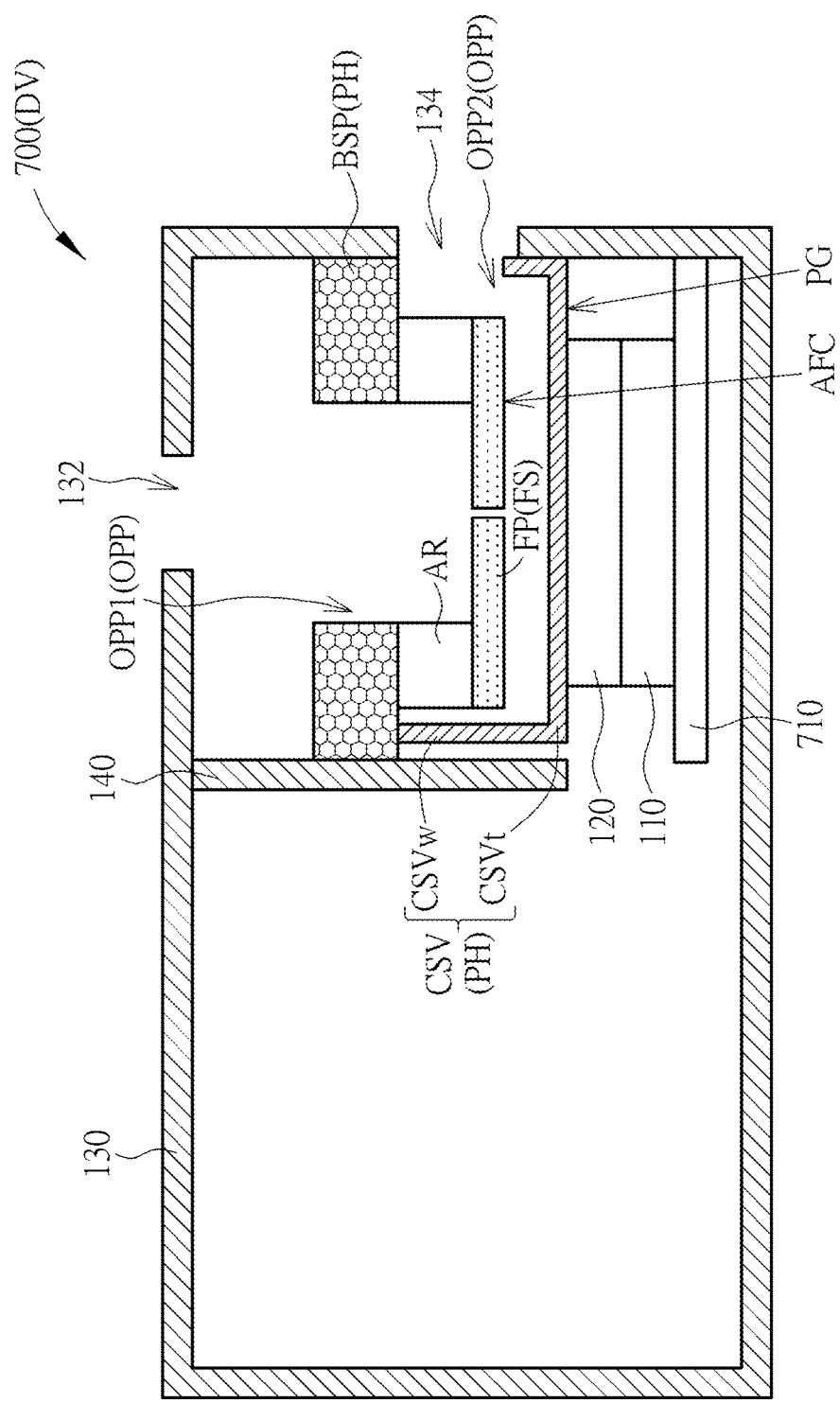
FIG. 17 is a schematic diagram of a cross sectional view illustrating a device with the heat source and the airflow generating chip according to a seventh embodiment of the present invention.

Referring to FIG. 17, FIG. 17 is a schematic diagram of a cross sectional view illustrating a device with the heat source and the airflow generating chip according to a seventh embodiment of the present invention, wherein the airflow generating package PG shown in FIG. 17 may belong to the second design DS2 shown in FIG. 5. As shown in FIG. 17, a difference between this embodiment and the embodiment shown in FIG. 15 is the design of the heat conductive component 120 of the device 700. In FIG. 17, the heat conductive component 120 may completely overlap the airflow generating package PG in the direction Z, and the heat source 110 may be connected to the covering structure CSV of the airflow generating package PG through the heat conductive component 120. For instance, the heat conductive component 120 may comprise a heat sink, a heat spreader, a thermal interface material, an interposer or a combination thereof, but not limited thereto. Furthermore, in FIG. 17, the heat source 110 may be disposed on a board 710 (e.g., a circuit board), such that the heat source 110 may be disposed between the board 710 and the heat conductive component 120, but not limited thereto.

In the following, the downsized devices DV are provided. For instance, the following device DV may be a semiconductor device which is a kind of the electronic device, wherein the semiconductor device may be formed by a semiconductor manufacturing process (the semiconductor manufacturing process include a package process), and the size of the semiconductor device may be similar to or the same as a size of a semiconductor package structure. Some embodiments of the devices DV which are the semiconductor devices are shown in FIG. 18 to FIG. 23, but the device DV is not limited by the following embodiments.

Figure 18:
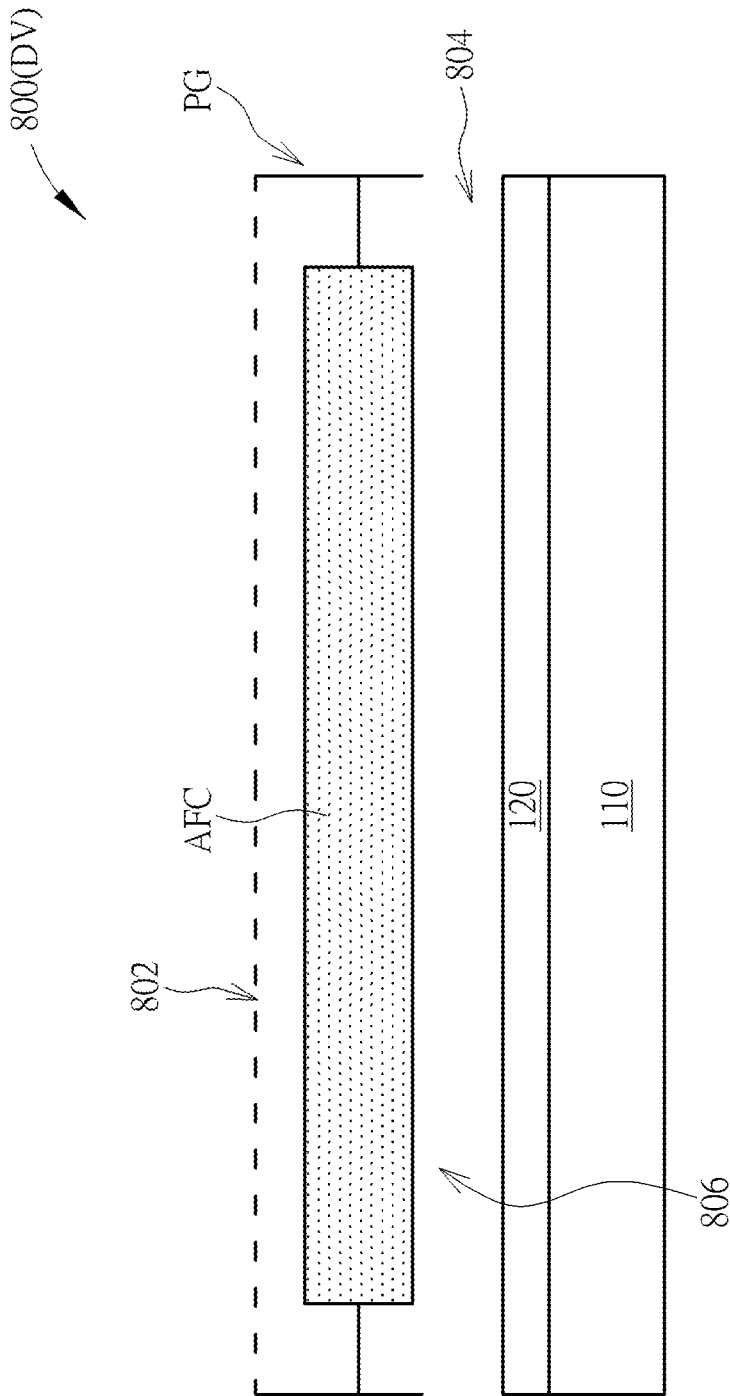
FIG. 18 is a schematic diagram of a cross sectional view illustrating a device with the heat source and the airflow generating chip according to an eighth embodiment of the present invention.

Referring to FIG. 18, FIG. 18 is a schematic diagram of a cross sectional view illustrating a device with the heat source and the airflow generating chip according to an eighth embodiment of the present invention, wherein the airflow generating component may be the airflow generating package PG with the airflow generating chip AFC (the details of the airflow generating package PG may be referred to the above). In the device 800 shown in FIG. 18, the airflow generating package PG with the airflow generating chip AFC may be disposed on and overlap the heat source 110 in the direction Z. Note that, the device 800 may be considered as a kind of semiconductor device, where the airflow generating chip AFC and the operational component (the heat source 110) are manufactured via semiconductor manufacturing process(es). The operational component (the heat source 110) may be or comprise an application processor (AP, for mobile devices such as smart phones or tablet computers), a central processing unit (CPU), a graphic processing unit (GPU), a tensor processing unit (TPU) or a memory, which generates heat while operating. The operational component may be considered as a kind of heat source 110.

Optionally, the device 800 may include the heat conductive component 120 disposed between the airflow generating package PG and the heat source 110, so as to enhance the heat dissipating effect. For example, the heat conductive component 120 may comprise a heat sink, a heat spreader, a thermal interface material, an interposer or a combination thereof, but not limited thereto. In some embodiments, the heat source 110 may be connected to the airflow generating package PG through the heat conductive component 120 (e.g., the heat source 110, the heat conductive component 120 and the airflow generating package PG (or the airflow generating chip AFC) may be overlapped in the direction Z). For example, the heat source 110 may be adhered to the airflow generating package PG through the heat conductive component 120, but not limited thereto.

In FIG. 18, the device 800 may have at least one first device opening 802 and at least one second device opening 804. Moreover, an air channel 806 is formed between the operational component (the heat source 110) and the airflow generating chip AFC, the airflow generated by the airflow generating chip AFC of the airflow generating package PG may pass through the air channel 806, the first device opening 802 and the second device opening 804, wherein the airflow may flow into the device 800 through the first device opening 802 or the second device opening 804 (i.e., one of the first device opening 802 and the second device opening

804 may be a device airflow inlet), and the airflow may flow out the device 800 through the first device opening 802 or the second device opening 804 (i.e., another of the first device opening 802 and the second device opening 804 may be a device airflow outlet), so as to dissipate heat generated by the heat source 110 (the operational component). Since the flowing direction of the airflow produced by the airflow generating chip AFC of the airflow generating package PG is reversible, the device airflow inlet and the device airflow outlet is exchanged when the airflow is reversed.

For instance, the first device opening 802 may be the air opening OPP1 of the package housing PH of the airflow generating package PG, and the second device opening 804 may be the air opening OPP2 of the package housing PH of the airflow generating package PG, but not limited thereto. For instance, the first device opening 802 or the second device opening 804 may be situated between the airflow generating package PG and the heat source 110, and not belong to the airflow generating package PG, but not limited thereto.

Figure 19:
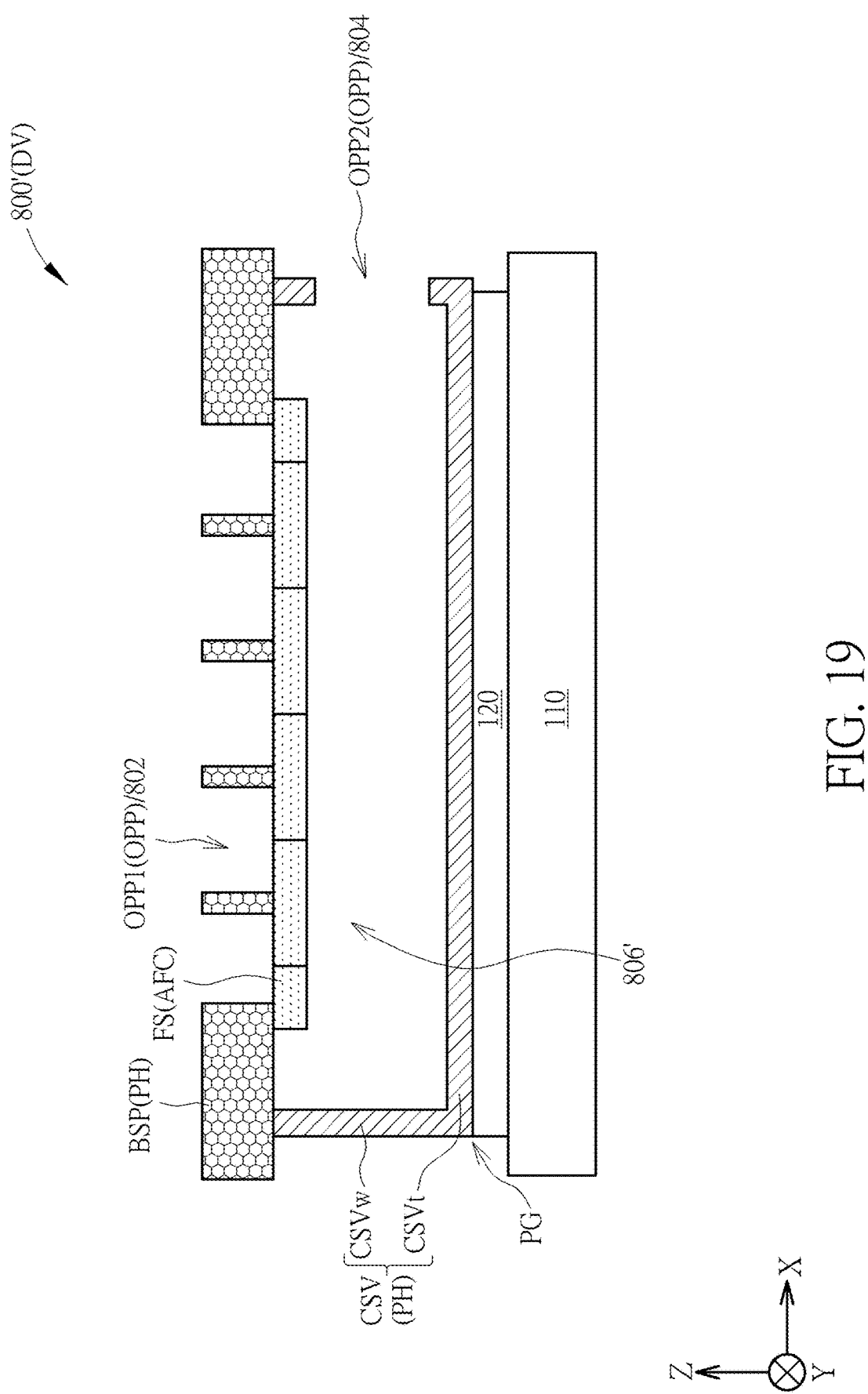
FIG. 19 is a schematic diagram of a cross sectional view illustrating an example of a device with the heat source and the airflow generating chip according to the eighth embodiment of the present invention.

An example of the device 800' belonging to the design shown in FIG. 18 is shown in FIG. 19, wherein the airflow generating package PG shown in FIG. 19 is a variant belonging to the second design DS2 shown in FIG. 5. As shown in FIG. 19, the airflow generating chip AFC may include a plurality of film structures FS. For brevity, the anchor structures AR within the airflow generating chip AFC are omitted in FIG. 19. In addition, the base BSP may have a plurality of air openings OPP1 overlapping the film structures FS of the airflow generating chip AFC, and the sidewall CSVw of the covering structure CSV may have one air opening OPP2, such that the direction of the airflow passing through the air opening OPP1 may be perpendicular to the direction of the airflow passing through the air opening OPP2. In FIG. 19, the first device openings 802 may be the air openings OPP1 of the airflow generating package PG, and the second device opening 804 may be the air opening OPP2 of the airflow generating package PG.

In FIG. 19, the covering structure CSV of the airflow generating package PG may be between the heat source 110 and the base BSP of the airflow generating package PG, and the heat source 110 may be connected to the covering structure CSV of the airflow generating package PG through the heat conductive component 120 (e.g., the heat conductive component 120 may be directly in contact with the heat source 110 and the covering structure CSV).

Moreover, cavity encompassed by the covering structure CSV may form an air channel 806'. That is, air channel 806' is formed between the operational component (the heat source 110) and the airflow generating chip AFC. Similarly, airflow generated by the airflow generating chip AFC may flow through the air channel 806' and air openings OPP1 and OPP2 and would dissipate heat generated by the operational component (the heat source 110).

Figure 20:
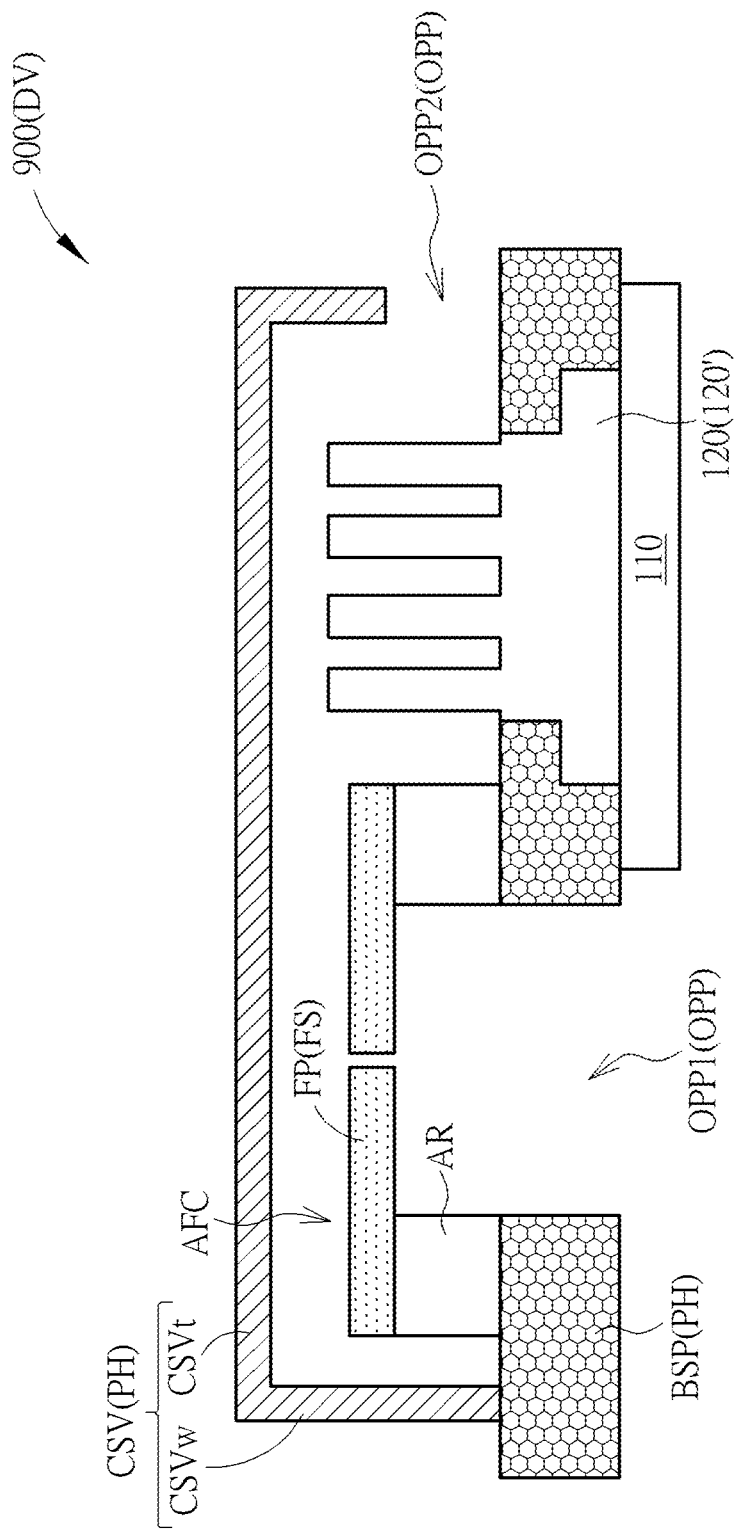
FIG. 20 is a schematic diagram of a cross sectional view illustrating a device with the heat source and the airflow generating chip according to a ninth embodiment of the present invention.

Referring to FIG. 20, FIG. 20 is a schematic diagram of a cross sectional view illustrating a device with the heat source and the airflow generating chip according to a ninth embodiment of the present invention, wherein the device 900 is an airflow generating package or a semiconductor device which is a package, and the airflow generating component is the airflow generating chip AFC. In FIG. 20, the device 900 which is the airflow generating package is similar to the second design DS2 of the airflow generating package PG shown in FIG. 5 (note that the device 900 may be similar to any design and/or any example of the airflow generating package PG described in above), such that the base BSP has one air opening OPP1 overlapping the film structure FS of the airflow generating chip AFC, and the sidewall CSVw of the covering structure CSV has one air opening OPP2.

The positions of the airflow generating chip AFC and the heat source 110 may be designed based on requirement(s), wherein the airflow generating chip AFC may be disposed adjacent to the heat source 110 (i.e., the airflow generating chip AFC may be disposed on, under or by the heat source 110). For instance, in FIG. 20, the airflow generating chip AFC and the heat source 110 may be respectively disposed on two opposite sides of the base BSP, wherein the airflow generating chip AFC may be between the base BSP and the covering structure CSV, but not limited thereto. For instance, the airflow generating chip AFC may not overlap the heat source 110 in the direction Z, but not limited thereto.

Optionally, the device 900 (i.e., the package) may include a fin-type heat conductive component 120' (a kind of the heat conductive component 120) disposed at any suitable position, so as to enhance the heat dissipating effect. For example, the fin-type heat conductive component 120' may comprise a heat sink, but not limited thereto. In some embodiments, the fin-type heat conductive component 120' may be disposed on the heat source 110 (e.g., the fin-type heat conductive component 120' may be connected to or have contact with the heat source 110) to obtain the heat generated by the heat source 110, and the fin-type heat conductive component 120' may pass through the base BSP to make the heat of the fin-type heat conductive component 120' be dissipated by the airflow generated by the airflow generating chip AFC (e.g., the airflow flows through the fin-type heat conductive component 120' and is configured to dissipate the heat from the heat source 110).

Note that, idea behind "fin-type" is to increase surface area so as to enhance heat dissipation, and heat sink or heat conductive component with "fin-type" is just for illustration purpose but not limited thereto. The fin-type heat conductive component 120' incorporates all kinds of heat sink or heat conductive component with non-smooth surface (e.g., heat sink or heat conductive component in regular or non-regular protrusions).

Figure 21:
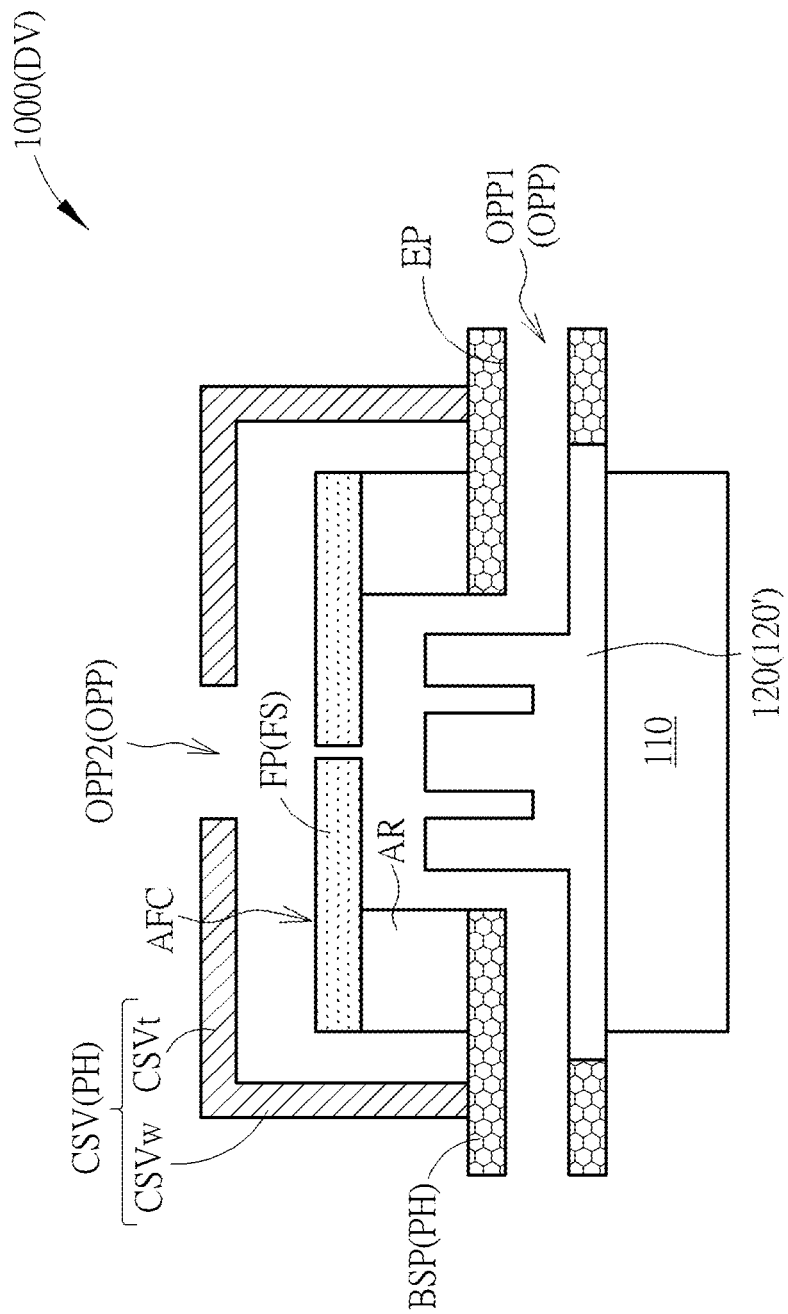
FIG. 21 is a schematic diagram of a cross sectional view illustrating a device with the heat source and the airflow generating chip according to a tenth embodiment of the present invention.

Referring to FIG. 21, FIG. 21 is a schematic diagram of a cross sectional view illustrating a device with the heat source and the airflow generating chip according to a tenth embodiment of the present invention, wherein the device 1000 is an airflow generating package or a semiconductor device which is a package, and the airflow generating component is the airflow generating chip AFC. In the device 1000 (i.e., the package) shown in FIG. 21, the device 1000 is similar to the fourth design DS4 of the airflow generating package PG shown in FIG. 5, such that the side surfaces of the base BSP have a plurality of air openings OPP1, and the top part CSVt of the covering structure CSV has one air opening OPP2.

Similar to the embodiment shown in FIG. 20, the airflow generating chip AFC and the heat source 110 may be respectively disposed on two opposite sides of the base BSP, the airflow generating chip AFC may be between the base BSP and the covering structure CSV, and the fin-type heat conductive component 120' may be disposed on the heat source 110 and pass through the base BSP.

In FIG. 21, the airflow generating chip AFC, the fin-type heat conductive component 120' and the heat source 110 may be overlapped in the direction Z, and the fin-type heat conductive component 120' may be disposed between the airflow generating chip AFC and the heat source 110. For instance (as shown in FIG. 21), the fin-type heat conductive component 120' may be a wall of the empty structure EP, but not limited thereto.

Figure 22:
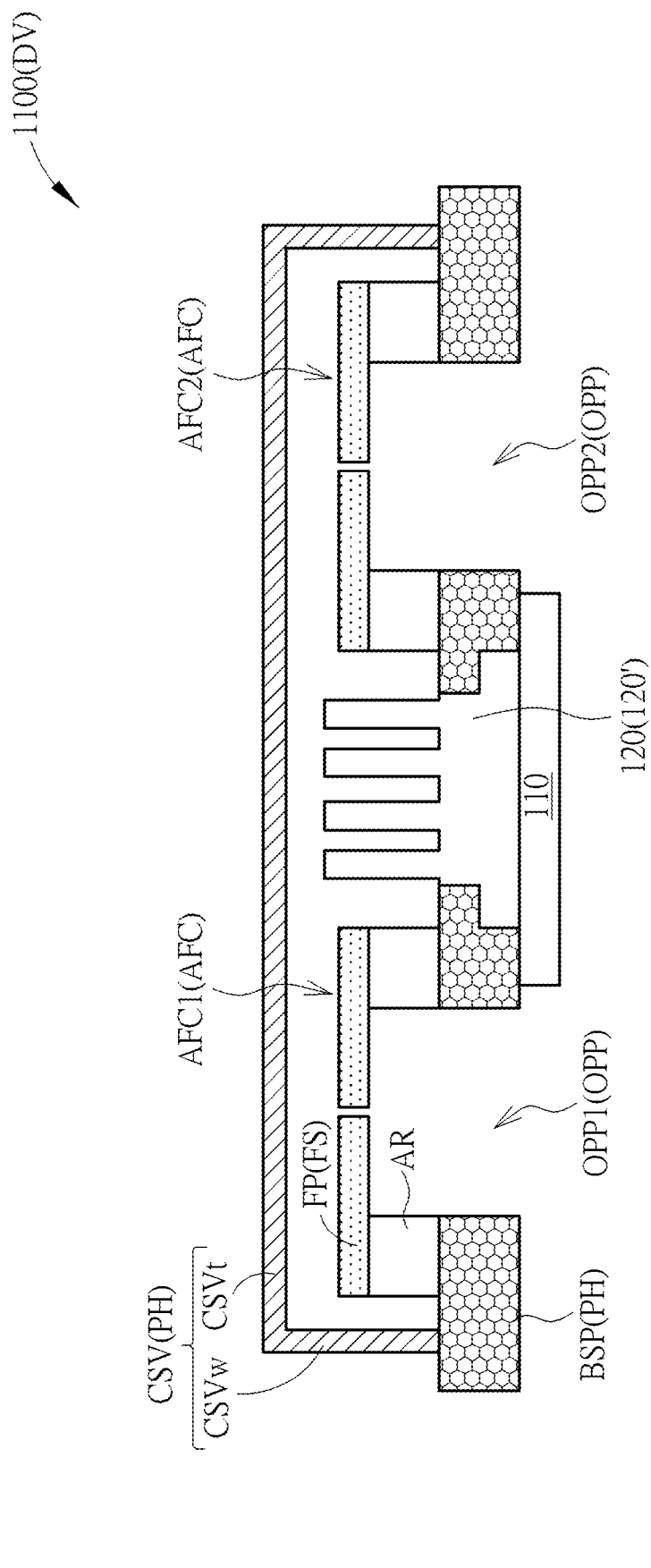
FIG. 22 is a schematic diagram of a cross sectional view illustrating a device with the heat source and the airflow generating chip according to an eleventh embodiment of the present invention.

Referring to FIG. 22, FIG. 22 is a schematic diagram of a cross sectional view illustrating a device with the heat source and the airflow generating chip AFC according to an eleventh embodiment of the present invention, wherein the device 1100 is an airflow generating package or a semiconductor device which is a package, and the airflow generating component is the airflow generating chip AFC. In the device 1100 (i.e., the package) shown in FIG. 22, the device 1100 may include a plurality of airflow generating chips AFC1 and AFC2 disposed on the base BSP, wherein the airflow generating chip AFC1 may be disposed by the airflow generating chip AFC2. In FIG. 22, the base BSP may have the air opening OPP1 overlapping the airflow generating chip AFC1 and the air opening OPP2 overlapping the airflow generating chip AFC2, such that the direction of the airflow passing through the air opening OPP1 may be parallel to the direction of the airflow passing through the air opening OPP2. Note that the flowing direction of the airflow generated by the airflow generating chip AFC1 is opposite to the flowing direction of the airflow generated by the airflow generating chip AFC2.

Similar to the embodiment shown in FIG. 20, the airflow generating chips AFC and the heat source 110 may be respectively disposed on two opposite sides of the base BSP, the airflow generating chips AFC may be between the base BSP and the covering structure CSV, and the fin-type heat conductive component 120' may be disposed on the heat source 110 and pass through the base BSP. For instance, the airflow generating chips AFC may not overlap the heat source 110 in the direction Z, but not limited thereto.

In FIG. 22, the heat source 110 and the fin-type heat conductive component 120' may be disposed between the airflow generating chips AFC1 and AFC2 in the horizontal direction (e.g., the direction X), but not limited thereto. For example, the airflow generating chip AFC1 may be disposed by a first side of the fin-type heat conductive component 120' and configured to form the airflow inward, and the airflow generating chip AFC2 may be disposed by a second side of the fin-type heat conductive component 120' and configured to form the airflow outward, but not limited thereto.

Figure 23:
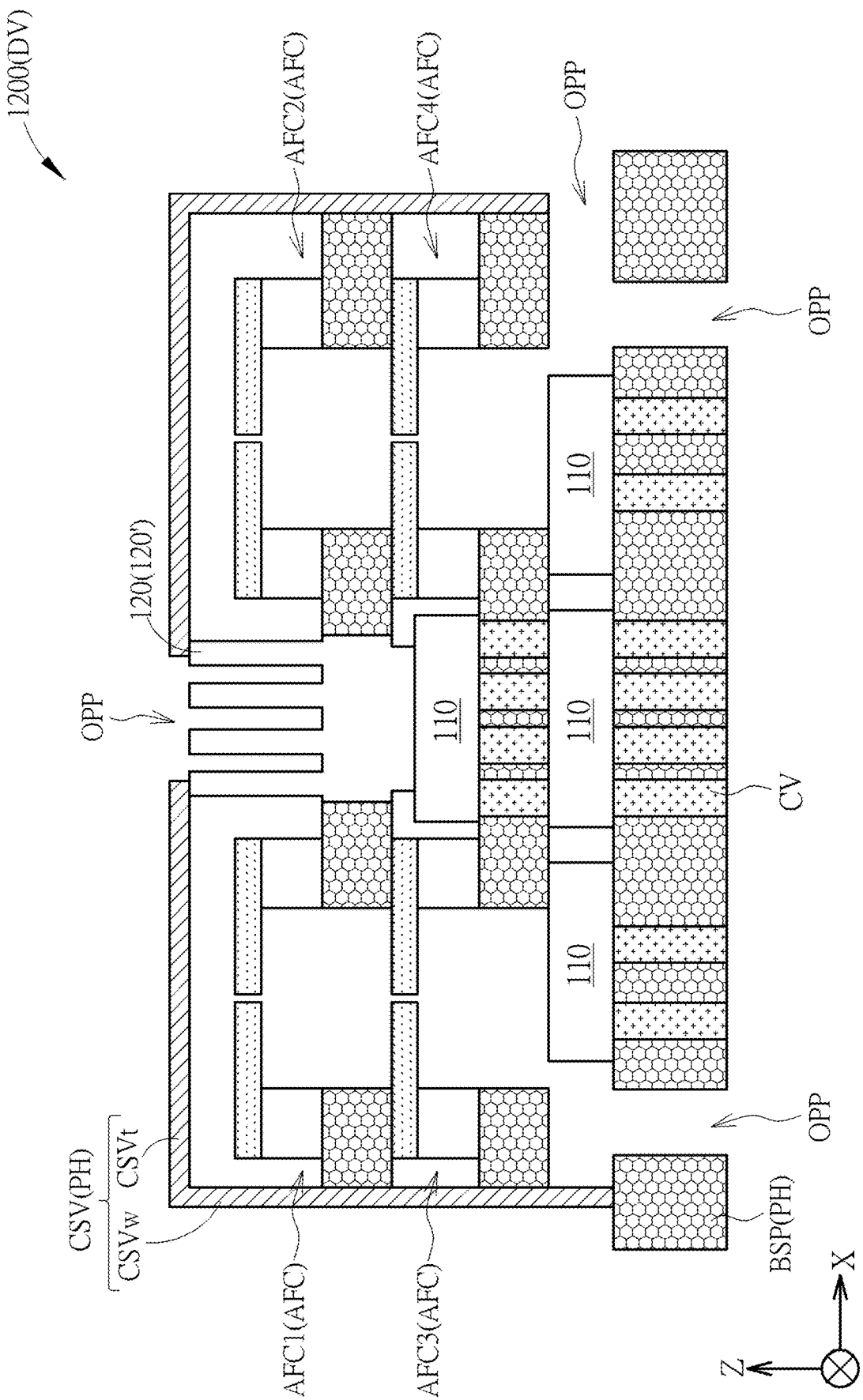
FIG. 23 is a schematic diagram of a cross sectional view illustrating a device with the heat source and the airflow generating chip according to a twelfth embodiment of the present invention.

Referring to FIG. 23, FIG. 23 is a schematic diagram of a cross sectional view illustrating a device with the heat source and the airflow generating chip according to a twelfth embodiment of the present invention, wherein the device 1200 is an airflow generating package or a semiconductor device which is a package, and the airflow generating component is the airflow generating chip AFC. In the device 1200 (i.e., the package) shown in FIG. 23, the device 1200 may include a plurality of airflow generating chips AFC and a plurality of heat sources 110, wherein the airflow generating chips AFC and the heat sources 110 may be disposed between the base BSP and the covering structure CSV. For instance, in FIG. 23, the heat sources 110 may be overlapped in the direction Z (e.g., one heat source 110 may be stacked on another heat source 110 to form a 3D integrated circuit), and the airflow generating chips AFC may be overlapped in the direction Z (e.g., the airflow generating chip AFC1 may be stacked on the airflow generating chip AFC3, and the airflow generating chip AFC2 may be stacked on the airflow generating chip AFC4). In FIG. 23, the airflow generating chips AFC may overlap the heat sources 110 in the direction Z, but not limited thereto.

In FIG. 23, the heat sources 110 and the fin-type heat conductive component 120' may be disposed between adjacent two airflow generating chips AFC in the horizontal direction (e.g., the direction X), but not limited thereto. For example, the stacked airflow generating chips AFC1 and AFC3 may be disposed by a first side of the fin-type heat conductive component 120', and the stacked airflow generating chips AFC2 and AFC4 may be disposed by a second side of the fin-type heat conductive component 120', but not limited thereto. In FIG. 23, the fin-type heat conductive component 120' may be disposed on the heat sources 110, but not limited thereto. In some embodiments, since the conductive structure CV (e.g., TSV) connected to the heat source 110 may have the heat conductive effect, the existence of the conductive structure CV may enhance the heat dissipating effect.

In some embodiments, the semiconductor device may be a semiconductor component SC including at least one airflow generating chip AFC and at least one heat source 110. For instance, the semiconductor component SC2 of FIG. 4 may be also referred as the semiconductor device, and the chip CP in FIG. 4 may be the heat source 110.

Figure 24:
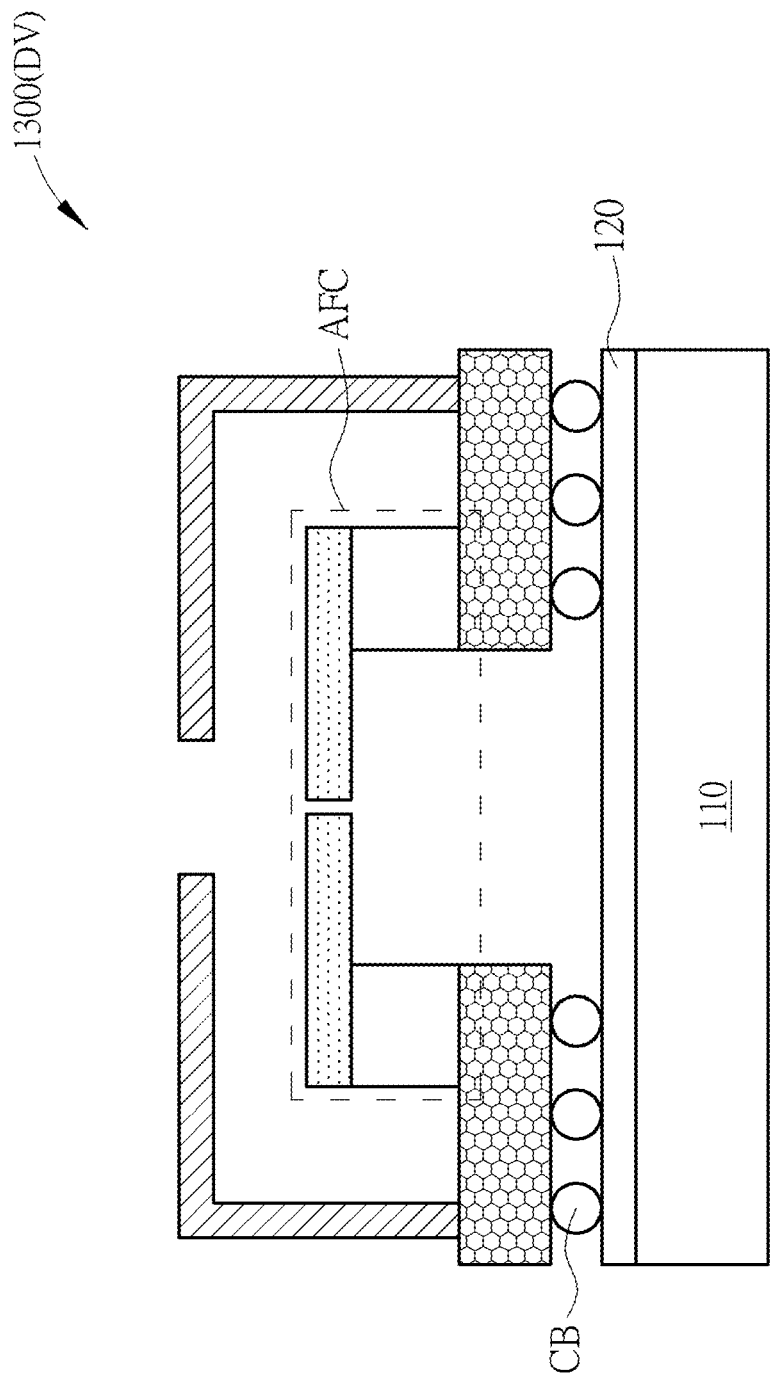
FIG. 24 illustrates a schematic diagram of a device according to an embodiment of the present application.
Figure 24:
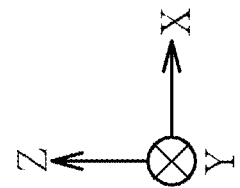

Notably, the embodiments stated in the above are utilized for illustrating the concept of the present application. Those skilled in the art may make modifications and alterations accordingly, and are not limited herein. For example, FIG. 24 illustrates a schematic diagram of a (semiconductor) device 1300 according to an embodiment of the present application. Different from previous embodiments, the semiconductor device 1300 comprises a plurality of thermal conductive balls CB (e.g., solder balls), and optionally comprises the heat conductive component 120. The conductive balls CB are disposed between the airflow generating chip AFC and the operational component (the heat source 110). Note that, the conductive balls CB have not only electrical but also thermal conductivity. The thermal conductive balls CB increase the component-to-air surface area and may be used to conduct heat generated by the operational component (the heat source 110). With the help of airflow generated by the airflow generating chip AFC, the heat generated by the operational component (the heat source 110) is dissipated effectively.

Figure 25:
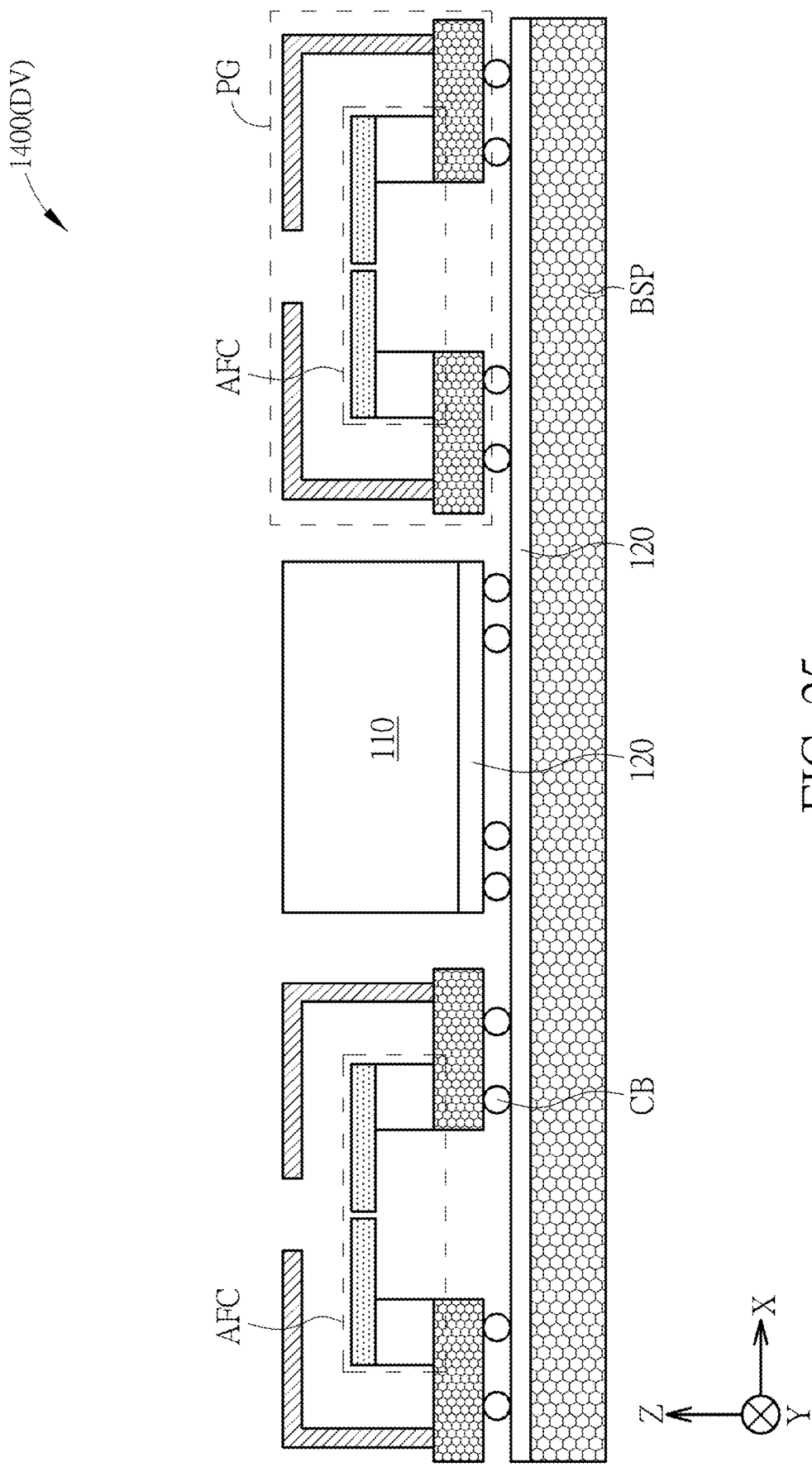
FIG. 25 illustrates a schematic diagram of a device according to an embodiment of the present application.

FIG. 25 illustrates another embodiment of a semiconductor device 1400 of the present application. Within the semiconductor device 1400, the airflow generating chip AFC and/or the airflow generating package PG may be disposed by the operational component (the heat source 110). The heat generated by the operational component (the heat source 110) (within the semiconductor device 1400) may be conducted via the heat conductive component 120 and/or the thermal conductive balls CB and be dissipated via the airflow generated by the airflow generating chip AFC and/or the airflow generating package PG. Note that, the airflow generating packages PG shown in FIG. 25 are top-firing (where opening is formed on a top of the covering structure), which is not limited thereto. The airflow generating packages PG with side-firing (where opening is formed on a sidewall of the covering structure) are also within the scope of the present application.

Figure 26:
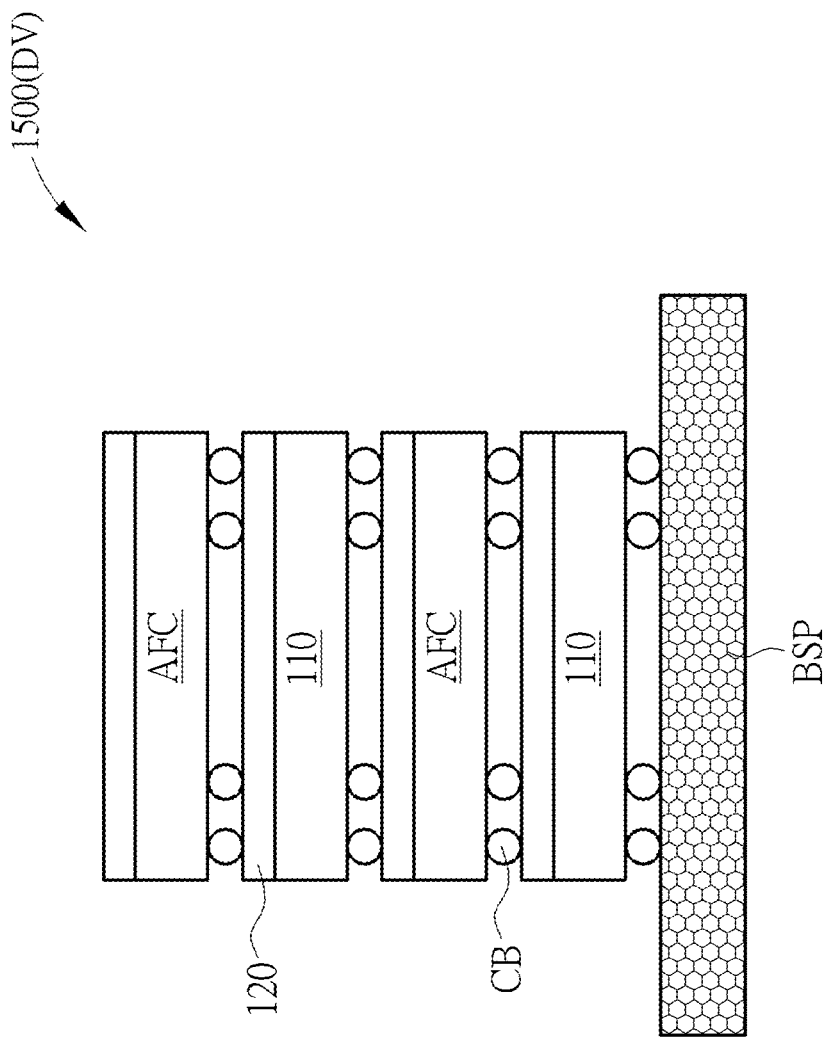
FIG. 26 illustrates a schematic diagram of a device according to an embodiment of the present application.

FIG. 26 illustrates another embodiment of a semiconductor device 1500 of the present application. The semiconductor device 1500 comprises a plurality of airflow generating chips AFC and a plurality of operational components (the heat sources 110), where the plurality of airflow generating chips AFC and the plurality of operational components (the heat sources 110) are stacked, which means that the plurality of airflow generating chips AFC and the plurality of operational components (the heat sources 110) (fully or partially) overlap in the normal direction of the base BSP (or the substrate). Furthermore, the stacked airflow generating chip(s) AFC and operational component(s) (the heat source(s) 110), such as the semiconductor device 1500, may be applied/disposed in advance packaging technology, such as 2.5D or 3D semiconductor package or CoWoS (Chip-on-Wafer-on-Substrate) package.

In an embodiment, the airflow generating chips AFC shown in FIG. 26 may be further packaged as/into airflow generating packages (e.g., PG), where the airflow generating packages (e.g., PG) may be stacked with the operational components (the heat sources 110), which is also within the scope of the present application.

Figure 27:
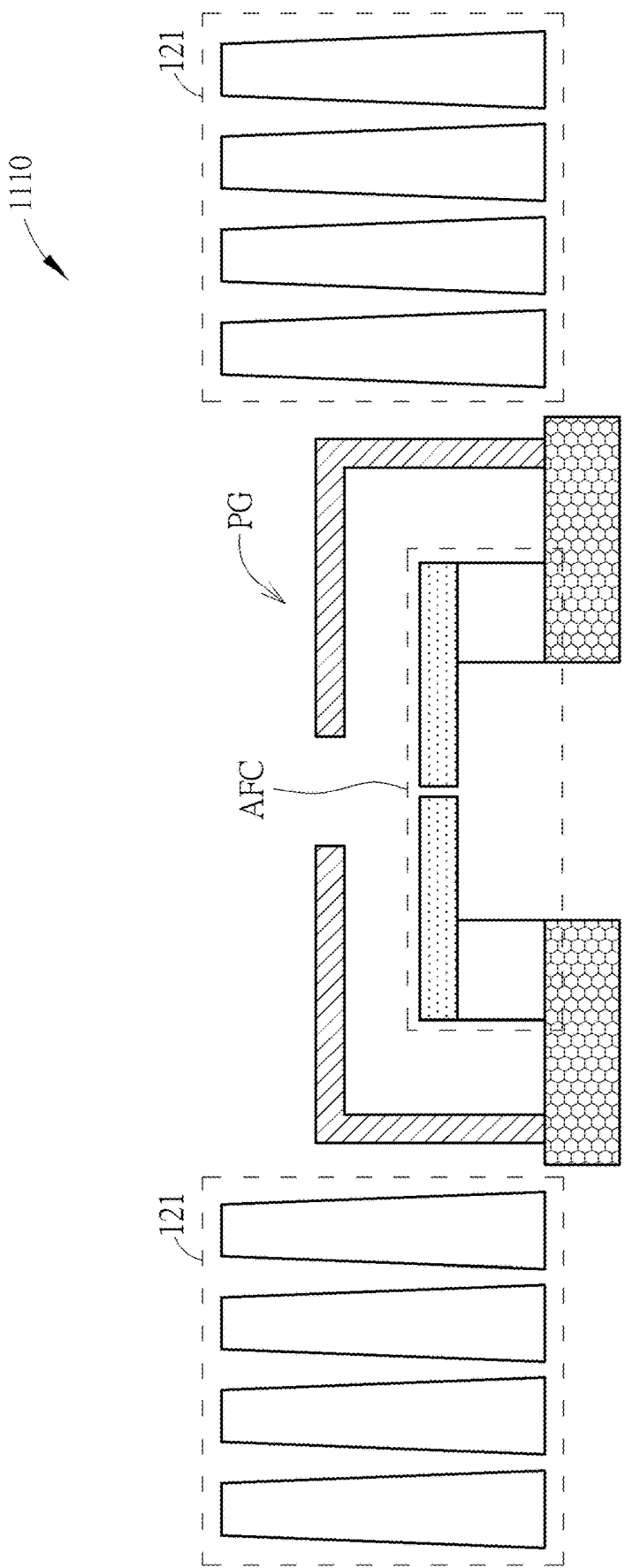
FIG. 27 illustrates a schematic diagram of a device according to an embodiment of the present application.

FIG. 27 illustrates another embodiment of a device 1110 of the present application. The device 1110 comprises the airflow generating chip AFC or the airflow generating package PG disposed adjacent to a heat sink 121. In the embodiment shown in FIG. 27, the airflow generating chip AFC or the airflow generating package PG is disposed by the heat sink 121, which generates airflow to dissipate heat carried by the heat sink 121. In an embodiment, the heat sink 121 may be a fin-type heat sink and can be as a kind of fin-type heat conductive component. Different from the device 1100, the fin-type heat conductive component is placed out of the airflow generating package PG, which is also within the scope of the present application.

Figure 28:
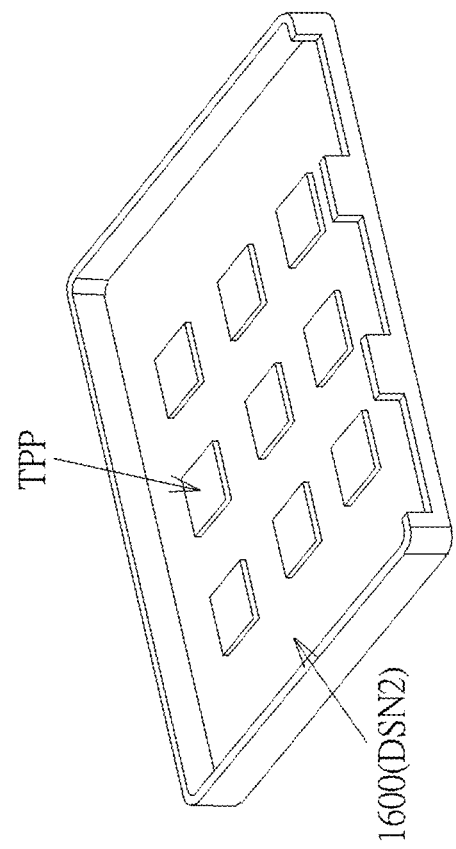
FIG. 28 illustrates a schematic diagram of designs of a covering structure according to embodiments of the present application.
Figure 28:
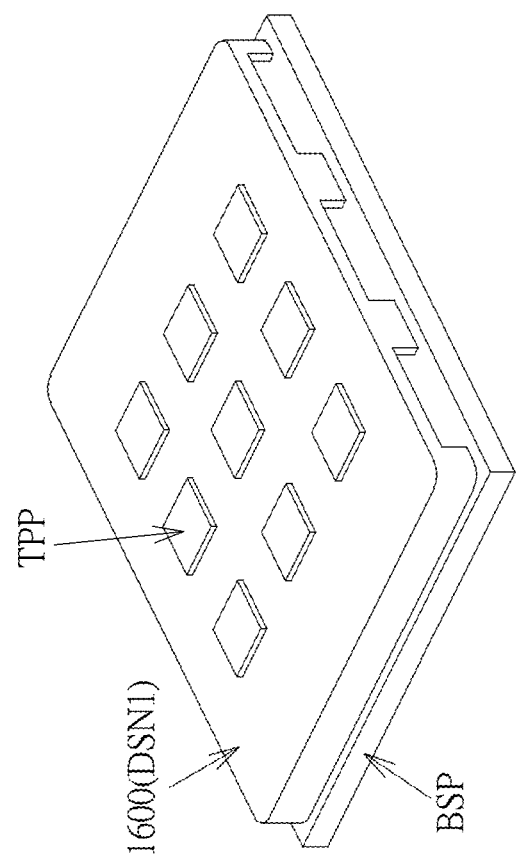

FIG. 28 illustrates embodiments of two designs DSN1 and DSN2 of a covering structure 1600 of the present application. In an embodiment, the covering structure 1600 may be a metal lid for airflow generating package of the present application. As shown in FIG. 28, the covering structures 1600 comprises a plurality of protrusions TPP disposed on the covering structure 1600, either on the exterior side (e.g., the design DSN1) or interior side (e.g., the design DSN2) of the covering structure 1600. The protrusions TPP of the covering structure 1600 function similar to the heat dissipating structure TP stated in the above (for enlarging the surface area and enhancing heat dissipation). The covering structure 1600 may be used to realize (all kinds of) the covering structure CSV for airflow generating package of the present application.

In an embodiment, the protrusions TPP may be disposed on the exterior and interior sides of the covering structure, which is also within the scope of the present application.

In summary, by the design of the heat conductive component of the present invention, the heat dissipation of the device is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
    an operational component, wherein the operational component produces a heat while operating;
    a heat conductive component configured to conduct the heat generated by the operational component, wherein the operational component is disposed on the heat conductive component; and
    an airflow generating package disposed by an edge of the electronic device;
    wherein the airflow generating package comprises a covering structure, a film structure and a base, and the film structure is disposed between the base and the covering structure;
    wherein the film structure operates at an ultrasonic rate to produce an airflow;
    wherein the heat conductive component extends toward the airflow generating package, such that the airflow generated by the airflow generating package flows through the heat conductive component, so as to dissipate the heat generated from the operational component through the heat conductive component;
    wherein the covering structure is disposed between the heat conductive component and the film structure.

2. The electronic device of claim 1, wherein the operational component and the airflow generating package are disposed on a side of the heat conductive component.

3. The electronic device of claim 1, wherein the operational component, the heat conductive component and the airflow generating package are overlapped in an actuating direction of the film structure.

4. The electronic device of claim 1, wherein the heat conductive component is adhered to the covering structure of the airflow generating package.

5. The electronic device of claim 1, wherein the airflow generating package comprises a heat dissipating structure, and the heat dissipating structure is distributed over the covering structure.

6. The electronic device of claim 1, further comprising an outer casing;
    wherein the operational component, the heat conductive component and the airflow generating package are disposed within the outer casing;
    wherein the outer casing comprises a first casing opening and a second casing opening, the airflow generated by the airflow generating package passes through the first casing opening and the second casing opening.

7. The electronic device of claim 6, wherein the airflow generating package produces the airflow through the first casing opening and second casing opening.

8. The electronic device of claim 1, wherein the heat conductive component comprises a heat sink or a heat spreader.

9. The electronic device of claim 1, wherein the heat conductive component comprises a thermal interface material.

10. The electronic device of claim 1, wherein the heat conductive component comprises an interposer.

11. The electronic device of claim 1, wherein the heat conductive component comprises a heat pipe or a vapor chamber.

12. The electronic device of claim 1, wherein a flowing direction of the airflow produced by the airflow generating package is reversible.

13. The electronic device of claim 1, wherein the airflow generating package and the operational component are separated by a spacer.

14. The electronic device of claim 1, wherein the airflow generating package comprises a semiconductor chip fabricated via a semiconductor manufacturing process, and the semiconductor chip is a micro electro mechanical system (MEMS) chip.

15. The electronic device of claim 1, wherein the operational component comprises an application processor (AP), a central processing unit (CPU), a graphic processing unit (GPU), a tensor processing unit (TPU) or a memory.

16. The electronic device of claim 1, wherein the film structure comprises a flap pair, and the flap pair comprises a first flap and a second flap.

17. An airflow generating package, comprising:
a base; and
an airflow generating chip comprising an anchor structure and a film structure anchored on the anchor structure;
wherein the airflow generating chip is disposed on the base, and the film structure operates at an ultrasonic rate so that the airflow generating package produces an airflow;
wherein an air channel is formed within the anchor structure on which the film structure is disposed, or the air channel is formed within the base on which the airflow generating chip is disposed, such that the airflow flows through the air channel;
wherein a flowing direction of the airflow within the air channel is perpendicular to a normal direction of the film structure.

18. The airflow generating package of claim 17, wherein the airflow generating package is disposed on or over a heat source or a heat conductive component, and the airflow produced by the film structure is to dissipate a heat from the heat source or the heat conductive component.

19. The airflow generating package of claim 17, wherein the film structure comprises a flap pair, and the flap pair comprises a first flap and a second flap.

20. An airflow generating package, comprising:
a base;
a film structure operating at an ultrasonic rate so that the airflow generating package produces an airflow; and
a covering structure, wherein a plurality of protrusions are disposed on the covering structure, so to enhance heat dissipation when the airflow produced by the film structure flows through;
wherein the film structure is disposed between the base and the covering structure.

21. The airflow generating package of claim 20, wherein an air opening is formed on a sidewall of the covering structure.

22. The airflow generating package of claim 20, wherein the film structure comprises a flap pair, and the flap pair comprises a first flap and a second flap.

23. An airflow generating package, comprising:
a housing; and
a film structure, disposed within the housing and operating at an ultrasonic rate so that the airflow generating package produces an airflow;
wherein an air opening is formed on a sidewall of the housing;
wherein the sidewall is perpendicular to the film structure.

24. The airflow generating package of claim 23, further comprising:
a chamber, formed on a side of the film structure;
wherein the housing comprises a base, and the base comprises the chamber;
wherein the air opening is formed on a sidewall of the base.

25. The airflow generating package of claim 24, wherein a Helmholtz resonance (HHR) is formed within the chamber.

26. The airflow generating package of claim 23, comprising:
a first airflow generating chip and a second airflow generating chip;
wherein the first airflow generating chip and the second airflow generating chip are stacked.

27. The airflow generating package of claim 26, wherein one of the first airflow generating chip and the second airflow generating chip is disposed in a flip-chip manner.

28. The airflow generating package of claim 23, wherein a first air opening is formed on a first sidewall of the housing.

29. The airflow generating package of claim 28, wherein a second air opening is formed on a second sidewall of the housing.

* * * * *